US012736877B2

(12) United States Patent
Lim et al.

(10) Patent No.: US 12,736,877 B2
(45) Date of Patent: Sep. 15, 2026

(54) SOLDER RESIST COMPOSITION, DRY FILM, PRINTED WIRING BOARD, AND METHODS FOR MANUFACTURING SAME

(71) Applicant: TAIYO INK MFG. CO., (KOREA) LTD., Ansan-si (KR)

(72) Inventors: Seok Bong Lim, Hwaseong-si (KR); Jong Chul Kwon, Ansan-si (KR); Young Ho Sa, Siheung-si (KR); Jin Kim, Siheung-si (KR); Byeong Jun Choi, Namdong-gu (KR); Joon Seok Kim, Hwaseong-si (KR); Jun Young Hwang, Ansan-si (KR); Na Ra Lee, Seongnam-si (KR); So Young Kim, Suwon-si (KR)

(73) Assignee: TAIYO INK MFG. CO., (KOREA) LTD., Ansan-Si (KR)

( * ) Notice: Subject to any disclaimer, the term of this patent is extended or adjusted under 35 U.S.C. 154(b) by 579 days.

(21) Appl. No.: 18/268,154

(22) PCT Filed: Dec. 14, 2021

(86) PCT No.: PCT/KR2021/018996
§ 371 (c)(1),
(2) Date: Jun. 16, 2023

(87) PCT Pub. No.: WO2022/131762
PCT Pub. Date: Jun. 23, 2022

(65) Prior Publication Data

US 2024/0061334 A1 Feb. 22, 2024

(30) Foreign Application Priority Data

Dec. 16, 2020 (KR) ........................ 10-2020-0176682

(51) Int. Cl.
*G03F 7/038* (2006.01)
*G03F 7/16* (2006.01)

(52) U.S. Cl.
CPC .............. *G03F 7/038* (2013.01); *G03F 7/168* (2013.01)

(58) Field of Classification Search
None
See application file for complete search history.

(56) References Cited

U.S. PATENT DOCUMENTS

2015/0234273 A1 8/2015 Matsuura et al.
2015/0382473 A1 12/2015 Okamoto et al.

FOREIGN PATENT DOCUMENTS

CN 101866108 A 10/2010
CN 103299242 A 9/2013
(Continued)

OTHER PUBLICATIONS

Machine translation of KR 2018005794 (Year: 2018).*
Office Action, and machine translation thereof, for JP Application No. 2023-536495, dated Mar. 7, 2024, 8 pages.

*Primary Examiner* — Martin J Angebranndt
(74) *Attorney, Agent, or Firm* — Stinson LLP

(57) ABSTRACT

The present invention relates to a solder resist composition, and more specifically, to: a solder resist composition that can be used to obtain high reflectance, excellent yellowing resistance, excellent crack resistance, high resolution and flatness, excellent sensitivity, developability, adhesion, solder heat resistance, pencil hardness, solvent resistance, HAST resistance, and high reflectance and high gloss after a HAST test; a dry film and a printed wiring board which include a solder resist layer obtained therefrom; and methods for manufacturing same. The solder resist composition according to the present invention can provide a dry film and a printed wiring substrate which have a solder resist layer,
(Continued)

Base film (PET film) peeled off before UV exposure

Base film (PET film) attached and then exposed to UV wherein the solder resist layer has excellent sensitivity, developability, adhesion, solder heat resistance, and solvent resistance, has high reflectance, experiences only a small decrease in reflectance even after high-temperature reflow and UV post-curing, experiences only a small decrease in reflectance even after being irradiated with blue light for 3000 hours, has excellent yellowing resistance and crack resistance, has excellent flatness and gloss, and has high resolution.

11 Claims, 1 Drawing Sheet

(56) References Cited

FOREIGN PATENT DOCUMENTS

CN 105739241 A * 7/2016 ........... G03F 7/0385
CN 106716251 A * 5/2017 ............... H05K 3/28
CN 110981995 A 4/2020
JP 03221955 A 9/1991
JP H10123311 A * 5/1998
JP 2008134621 A 6/2008
JP 2010085768 A * 4/2010
JP 2010243599 A * 10/2010
JP 4884736 B2 2/2012
JP 2014238438 A 12/2014
JP 2015158638 A 9/2015
JP 2015193786 A * 11/2015
JP 2017126044 A * 7/2017
JP 2017134173 A 8/2017
JP 2018036574 A * 3/2018
JP 2018165765 A 10/2018
JP 2019019291 A 2/2019
JP 2020138992 A 9/2020
KR 10-2008-0036920 A 4/2008
KR 10-2014-0023323 A 2/2014
KR 10-2014-0147047 A 12/2014
KR 10-2015-0142615 A 12/2015
KR 10-2017-0020222 A 2/2017
KR 10-2017-0063859 A 6/2017
KR 10-2018-0057943 A 5/2018
KR 10-2020-0139632 A 12/2020

* cited by examiner

[Fig.1]
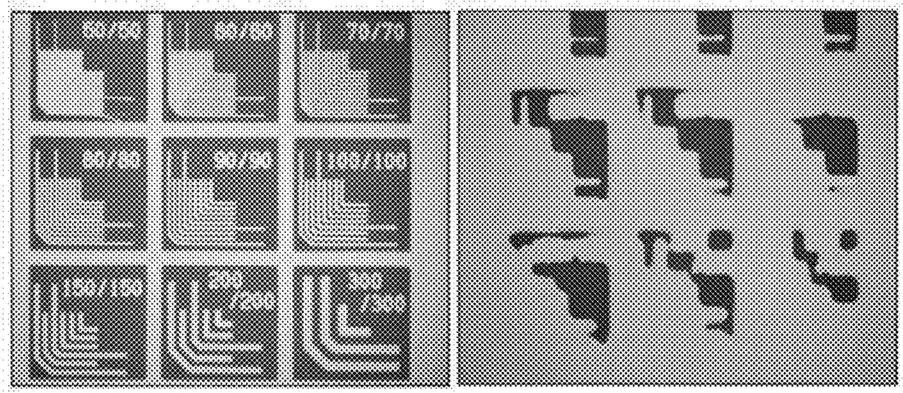
Base film (PET film) peeled off before UV exposure
Base film (PET film) attached and then exposed to UV
[Fig.2]
| Erichsen Test | Example 1 | Example 2 | Example 3 | Example 4 | Example 5 | Example 6 | Comparison 1 | Comparison 2 | Comparison 3 |
|---|---|---|---|---|---|---|---|---|---|
| 0.8mm | | | | | | | | | |
| 1.2mm | | | | | | | | | |
| 1.6mm | | | | | | | | | |
| 2.0mm | | | | | | | | | |

SOLDER RESIST COMPOSITION, DRY FILM, PRINTED WIRING BOARD, AND METHODS FOR MANUFACTURING SAME

REFERENCE TO RELATED APPLICATIONS

This application is a 371 U.S. national stage application of International Patent Application No. PCT/KR2021/018996, filed Dec. 14, 2021, which claims the benefit of Korean Patent Application No. 10-2020-0176682, filed Dec. 16, 2020, the entire disclosures of which are incorporated herein by reference.

TECHNICAL FIELD

The present invention relates to a solder resist composition. More specifically, a solder resist composition having high reflectance, good yellowing resistance, good crack resistance, high resolution and flatness, good sensitivity, developability, adhesion, solder heat resistance, pencil hardness, solvent resistance, and HAST resistance, and high reflectance and high gloss after HAST testing, and a solder resist layer obtained therefrom, and a dry film and a printed wiring board comprising the same, and a manufacturing method thereof.

BACKGROUND ART

For printed writing boards generally used in electronic devices and etc., the invention prevents solder from adhering to unnecessary areas when mounting electronic components on printed wiring boards and in order to prevent the conductors of the circuit from being exposed and corroded by oxidation or humidity, a layer of solder resist is formed in the area except for the connection holes on the board where the circuit pattern is formed.

With the recent lightweight miniaturization of electronic devices, printed wiring boards have come to require high precision and high density. The most dominant way of manufacturing the solder resist layer currently is by applying a photosensitive resin ink to the substrate, forming a pattern by exposure and development, and then curing the patterned resin by heating or light irradiation, which corresponds to the so-called photo solder resist.

The liquid photosensitive resin ink described above has the problem of a long work time because printing and ink drying processes must be repeated during manufacturing.

Thus, using the so-called photosensitive dry films, which omits the drying process after ink application, instead of liquid photosensitive resin ink has been proposed for forming the solder resist layer. Laminating with a dry film reduces the working time, thus greatly shortening the manufacturing process and increasing productivity.

Such a dry film generally forms a solder resist layer, which is a photosensitive resin layer, on a base film, includes a laminate having a protective film bonded to said layer, and when used, the protective film is peeled off and heated and pressed onto the wiring board, and the support film is peeled off after exposure from the base film, and thus forms a patterned solder resist layer. Compared to using a liquid photosensitive resin ink as described above, using a dry film to form the solder resist layer enables omitting the ink drying process and makes it difficult for air bubbles to be incorporated between the board and the solder resist layer because the dry film is pressed against the circuit board, thereby improving the embeddedness of the holes in the recesses of the board surface. In addition, using dry film to form the solder resist layer ensures that the film has excellent flatness and that the chip is mounted efficiently and thus results in high resolution.

However, especially in the case of a white solder resist layer, which are more reflective than colored solder resist layers, when a solder resist layer is formed using a dry film in the manner described above, light is reflected from the surface of the solder resist layer when exposed to light, making it difficult for light to penetrate to the lower part of the solder resist layer, and halation occurs on the surface, making it difficult to realize patterns. In addition, white solder resist layer has poor HAST resistance after HAST test, and the reflectance drops rapidly due to corrosion of the copper electrode.

On the other hand, the solder resist layer also functions as a permanent protective layer on the circuit board, so solder resist compositions are required to have a variety of performance features, such as alkali-resistance and solder heat resistance. In addition, the solder resist layer formed by the solder resist composition requires crack resistance, development, adhesion, solder heat resistance, solvent resistance, etc.

Also, it is very important for the white solder resist layer to achieve high reflectance because it can also function as the backlight of the display. In addition, when the white solder resist layer is exposed to harsh environments such as heat, UV, blue light, and HAST, it is very important that the white solder layer has a high reflectance and maintains the high reflectance without yellowing of the cure when exposed to heat or light, and also shows a small decrease in reflectance due to the manufacturing process. Furthermore it is required of white solder resist layers to have high HAST resistance and high reflectance after HAST testing when evaluated for their reliability.

Patent document 1 is an invention for providing a photosensitive resin composition with high conductivity and excellent resolution, and it discloses a photosensitive resin composition comprising a carboxyl group-containing resin, a photopolymerization initiator, and at least two perovskite-type compounds, wherein one of the perovskite-type compounds is barium titanate.

Patent document 2 is an invention for providing a photosensitive element that has a photosensitive layer with good resolution and heat resistance. It discloses a photosensitive element having a photosensitive layer, a support, a support film, and a non-photosensitive resin layer, comprising (A) component: a resin having a phenolic hydroxyl group, (B) a component: a photosensitivie acid generator, and (C) a component: at least one compound selected from the group consisting of an aliphatic cyclic compound, an aliphatic compound, and a compound in which some of the constituent carbons of the compound are substituted with heteroatoms, including a compound having at least two of at least one species selected from the group consisting of a methylol group and an alkoxyalkyl group.

However, there is a demand for compositions that satisfy the basic properties required for a solder resist layer along with the additional properties required for a white solder resist layer. For example, the demand for a solder resist composition that has a higher reflectance than conventional solder resists and has excellent crack resistance, yellowing resistance, and HAST resistance, and also a high reflectance after HAST testing, particularly for a method of manufacturing dry film and printed wiring boards that include a solder resist layer that can resolve the certain problems inherent in the manufacturing process of a white solder resist layer.

DETAILED DESCRIPTION OF THE INVENTION

Problem to be Solved

The objective of the present invention is to provide a solder resist composition with improved surface hardening compared to a conventional solder resist layer, resulting in high reflectance, less reduction in reflectance during the manufacturing process, good yellowing resistance, good crack resistance, and high resolution and flatness; and a solder resist layer obtained therefrom; and a dry film and printed wiring board comprising the same; and a manufacturing method thereof.

The objective of the present invention is to provide a method for manufacturing a printed wiring board that solves the halation phenomenon that occurs at an upper portion when manufacturing a printed wiring board including a white solder resist layer, maintains high reflectance when exposed to UV and heat, and has excellent resistance and reflectance after HAST testing.

Means for Solving the Problem

The present inventors have found that the following solder resist compositions, dry films, printed wiring boards, and methods of manufacturing them can address the above challenges.

<1> A solder resist composition comprising (A) a carboxyl group-containing resin not containing an aromatic ring, (B) an inorganic filler, (C) a mercapto-modified acrylate and (D) a resin containing an aromatic ring.

<2> The solder resist composition according to <1>, which is white.

<3> The solder resist composition according to <1>, further comprising a thermosetting resin.

<4> The solder resist composition according to <3>, wherein the thermosetting resin is an epoxy resin.

<5> The solder resist composition according to <3>, wherein the equivalent ratio (epoxy group/carboxyl group equivalent ratio) obtained by dividing the epoxy group equivalent contained in the epoxy resin by the carboxyl group equivalent contained in the carboxyl group-containing resin is 0.5 or more and 1.2 or less.

<6> The solder resist composition according to <1> or <5>, wherein the content of (C) the mercapto-modified acrylate is 2% by mass ~6% by mass based on the total composition.

<7> The solder resist composition according to <1>, wherein (C) the mercapto-modified acrylate is an aliphatic compound having 1 to 15 carbon atoms substituted with at least one functional group selected from the group consisting of acryloyl group, acryloyloxy group and acryloyloxyalkyl group.

<8> A dry film having a solder resist layer which is obtained by applying the solder resist composition of <1> on the base film and drying it.

<9> A cured product obtained by curing the solder resist layer of the dry film according to <8>

<10> A printed wiring board comprising the cured product of <9>.

<11> A method of preparing a dry film, comprising the following steps.

1) a step of applying the solder resist composition of <1> on a base film;

2) a step of drying the applied solder resist composition to form a solder resist layer;

3) a step of combining the dried solder resist layer with a protective film.

<12> A method of preparing a printed wiring board, comprising the following steps.

1) a step of laminating the dry film of <8> so that the solder resist layer is combined on a substrate, and vacuum laminating;

2) a step of peeling the base film of the dry film, and then exposing the solder resist layer;

3) a step of forming a pattern by developing the solder resist layer to remove the unexposed areas of the solder resist layer;

4) a step of curing the substrate on which the pattern is formed.

Effect of the Invention

The solder resist composition according to the present invention can provide a dry film and a printed wiring board which have a solder resist layer, wherein the solder resist layer has excellent sensitivity, developability, adhesion, solder heat resistance, and solvent resistance, has high reflectance, experiences only a small decrease in reflectance even after high-temperature reflow and UV post-curing, experiences only a small decrease in reflectance even after being irradiated with blue light for 3000 hours, has excellent HAST resistance, high reflectance after HAST testing, excellent yellowing resistance and crack resistance, has excellent flatness and gloss, and has high resolution.

The dry film comprising the solder resist layer obtained from the solder resist composition of the present invention is capable of high reflectance of 92 to 93% or more, and has a small decrease in reflectance compared to ordinary inks, especially white inks, even after UV treatment after high temperature reflow and final curing. In addition, even after 3000 hours of blue light irradiation, the decrease in reflectance is less than that of general inks, especially white ink and other solder resist layers. Moreover, it has excellent crack resistance and gloss.

A printed wiring board comprising a solder resist layer manufactured by a manufacturing method according to the present invention has high resolution.

BRIEF DESCRIPTION OF THE DRAWINGS

FIG. 1 is a comparison between a printed wiring board which has been exposed to tight with a base film peeled off before UV exposure and a printed wiring board which has been exposed without a base film being peeled off before UV exposure.

FIG. 2 shows the results of an Erichsen test in Examples 1 to 6 and Comparisons 1 to 3.

BEST MODES TO CARRY OUT THE INVENTION

Hereinafter, embodiments of the present invention are described in further detail.

Solder Resist Composition

The solder resist composition of the present invention (hereinafter, also referred to as a "resin composition") is a photosensitive resin composition. The resin composition comprises of (A) a carboxyl group-containing resin not containing an aromatic ring, (B) an inorganic filler, (C) a mercapto-modified acrylate and (D) a resin containing an aromatic ring. Also, the resist composition may include (E) a silane coupling agent, (F) a resin having a urethane bond, and other optional components.

The solder resist composition of the present invention, due to the combination of (A) to (D), can have a high reflectance, experiences only a small decrease in reflectance during a manufacturing process, and excellent yellowing resistance, excellent crack resistance, excellent sensitivity, developability, adhesion, solder heat resistance, pencil hardness, solvent resistance, HAST resistance, and high reflectance and high gloss after a HAST test.

The solder resist composition of the present invention can have an improved crack resistance, a higher reflectance, and a higher gloss, when (E) is further added to the composition along with the combination of (A) to (D).

The solder resist composition of the present invention can have an increased flexibility and improved resistance to cracks or breaking when being bent or subject to external impact by further including (F) in addition to the combination of the (A) to (D).

The solder resist composition of the present invention can be white.

The "white" color above was obtained after laminating the solder resist on the FR-4 substrate, irradiating a light amount of 300 mJ/cm$^2$ using a DI exposer of LEDIA 5 manufactured by SCREEN for UV exposure, developing the solder resist for 1 minute in a 1% $Na_2CO_3$ solution (developer temperature: 30° C.), performing final curing at 150° C. for 1 hour in a box oven, and manufacturing a 55 μm solder resist coating film, passing it once for 10 seconds under a reflow condition 260° C., and then the L, a, and b values of the coating surface of the substrate are measured using a spectrophotometer (CM-2600d by Konica Minolta Sensing Co., Ltd.), and as a result of the measurement, the L value of the spectrophotometer is 70 or more, the a value is −5 or more, and the b value is −5 or more. In this case, L, a, and b are not changed according to the lamination condition.

(A) a Carboxyl Group-Containing Resin not Containing an Aromatic Ring

For the solder resist composition of the present invention, for (A) a carboxyl group-containing resin not containing an aromatic ring (hereinafter, "resin (A)") can be a kind of resin that exhibits electrical insulation due to being cured by irradiation with active energy rays and particularly for the present invention a compound without a benzene ring may be preferably used.

Since resin (A) contains an unsaturated double bond, radical curing by ultraviolet rays, electron beams, or heat is possible, and alkali development is possible because it contains a carboxyl group. Resin (A), because it is a carboxyl group-containing aliphatic resin not containing an aromatic ring, has excellent resistance to discoloration or yellowing when subjected to heat or UV energy. In addition, combining resin (A) with the inorganic filler (B) yields a high reflectance, a smaller decrease in reflectance after reflow, and also a smaller decrease in reflectance after being subject to 3000 hours of blue light testing. Therefore, resin (A) experiences less decrease in reflectance resulting from discoloration and yellowing compared to other inks and shows excellent resistance to yellowing.

For (A) a carboxyl group-containing resin not containing an aromatic ring, both a photosensitive carboxyl group-containing resin having at least one photosensitive unsaturated double bond and a carboxyl group-containing resin not having a photosensitive unsaturated double bond may be used, and the present invention is not limited to a specific one. Especially from the enumerated resins given below, any one that does not have an aromatic ring (any of oligomers or polymers) may be suitably used: (1) a carboxyl group-containing resin obtained by copolymerization of an unsaturated carboxylic acid and a compound having an unsaturated double bond; (2) a photosensitive carboxyl group-containing resin obtained by reacting a carboxyl group-containing (meth)acrylic copolymer resin with a compound having an oxirane ring and an ethylenically unsaturated group in one molecule; (3) a photosensitive carboxyl group-containing resin obtained by reacting a copolymer unsaturated monocarboxylic acid of a compound having an unsaturated double bond and a compound having an unsaturated double bond with one epoxy group in each molecule, and reacting a second hydroxyl group-saturated or unsaturated polybasic acid anhydride produced by the reaction; (4) a resin containing a photosensitive hydroxyl group and a carboxyl group, which is obtained by reacting a hydroxyl group-containing polymer saturated or unsaturated polybasic acid anhydride, and then reacting each compound having one epoxy group and an unsaturated double bond in one carboxylic acid molecule generated by the reaction.

Among these, a copolymer resin having a carboxyl group, which is the resin containing the photosensitive carboxyl group of (2), and obtained by the reaction of reacting (a) a carboxyl group-containing (meth)acrylic copolymer resin with (b) a compound having an oxirane ring and an ethylenically unsaturated group in one molecule is preferred.

The (a) carboxyl group-containing (meth)acrylic copolymer resin may be obtained by copolymerizing a (meth) acrylic acid ester with a compound having one unsaturated group and at least one carboxyl group in one molecule. The (meth)acrylic acid esters constituting the copolymerization resin (a) include: (meth)acrylic acid alkyl esters such as methyl(meth)acrylate, ethyl(meth)acrylate, propyl(meth) acrylate, butyl(meth)acrylate, pentyl(meth)acrylate, and hexyl(meth)acrylate; (meth)acrylic acid esters containing hydroxyl groups such as 2-hydroxyethyl(meth)acrylate, hydroxypropyl(meth)acrylate, hydroxybutyl(meth)acrylate, and caprolactone-modified 2-hydroxyethyl(meth)acrylate; glycol-modified (meth)acrylates such as methoxydiethylene glycol(meth)acrylate, ethoxy di ethylene glycol(meth)acrylate, isooctyloxyethylene glycol(meth)acrylate, phenoxy triethylene glycol(meth)acrylate, methoxytriethylene glycol (meth)acrylate, and methoxypolyethylene glycol(meth) acrylate and the like. These can be used alone or in combination of two or more. Also, in the present specification, (meth)acrylate is a generic term for acrylate and meth acrylate, and the same applies to other similar expressions.

In addition, the following can qualify for a compound having one unsaturated group and at least one carboxyl group in one molecule: acrylic acid; methacrylic acid; a modified unsaturated monocarboxylic acid having a chain extended between an unsaturated group and a carboxylic acid; for example, unsaturated monocarboxylic acids with ester bonds by β-carboxyethyl (meth)acrylate, 2-acryloyloxyethyl cohacic acid, 2-acryloyl oxy ethyl hexahydrophthalic acid, lactone modification, etc.; modified unsaturated monocarboxylic acid having ether bond; and also those containing two or more carboxyl groups such as maleic acid in the molecule, etc. These may be used alone or in combination of two or more.

For the (b) compound having an oxirane ring and an ethylenically unsaturated group in one molecule, a compound having an ethylenically unsaturated group and an oxirane ring in one molecule will do, and examples thereof may include glycidyl(meth)acrylate, α-methylglycidyl (meth)acrylate, 3,4-epoxy cyclohexylmethyl(meth)acrylate, 3,4-epoxycyclohexylethyl (meth)acrylate, 3,4-epoxycyclohexylbutyl(meth)acrylate, 3,4-epoxycyclohexyl methylaminoacrylate, and the like. In particular, 3,4-epoxycyclohexylmethyl(meth)acrylate is preferred. (b) The compound having an oxirane ring and an ethylenically unsaturated group in one molecule may be used alone or in combination of two or more.

Carboxyl group-containing resin A) not containing an aromatic ring has an acid value in the range of 30 to 200 mgKOH/g. When the acid value is less than 30 mgKOH/g, it is difficult to remove the unexposed portion of the solder resist composition coating film in the aqueous weak alkali solution. When the oxidation exceeds 200 mgKOH/g, there are problems such as deterioration of water resistance and electrical properties of the cured film. In addition, the weight average molecular weight of the carboxyl group-containing resin (A) containing no aromatic ring is preferably in the range of 5,000 to 100,000. When the weight average molecular weight is less than 5,000, the dry to touch property of the solder resist composition coating tends to be significantly lowered. In addition, when the weight average molecular weight exceeds 100,000, developability and storage stability of the solder resist composition are significantly deteriorated, which is not preferable.

The amount of the resin (A) in the solder resist composition of the present invention is in the range of 5 to 25 mass %, preferably in the range of 10 to 20 mass %, and more preferably in the range of 12 to 19 mass %, based on the total weight of the resin composition. The resin composition includes a solid and a solvent.

When the content of the resin (A) is within the above range, yellowing resistance is excellent, and high reflectance can be achieved. When the amount of the resin (A) is less than or equal to the above range, the solder resist coating film is not well formed, and there may be problems in pencil hardness, adhesion, and the like. When the content of the resin (A) exceeds the above range, the dry to touch property of the coating film decreases, and the undercut deteriorates.

(B) An Inorganic Filler

The solder resist composition of the present invention makes it possible to obtain high reflectance by including an inorganic filler.

Examples of the inorganic filler may include titanium oxide, zinc oxide, basic carbonate, basic sulfate, sulfate, zinc sulfide, antimony oxide, aluminum hydroxide, silica, barium sulfate, and the like. For example, a mixture of barium sulfate and silica is used as an inorganic filler. For example, when the composition is prepared by using the mixture of barium sulfate and silica as an inorganic filler, the L value is 80 or more, the a value −5 or more, and the b value −5 or more. Preferably, when the composition is implemented using a high content of titanium oxide and silica as an inorganic filler, the L value is 90 or more, the a value −3 or more, and the b value −3 or more, and thus the whiteness and the reflectance are high. More preferably, when the composition is implemented using titanium oxide as an inorganic filler, the L value is 95 or more, the a value −2 or more, and the b value −1 or more, and the whiteness and the reflectance are the highest.

For example, any one of a sulfuric acid method and a chlorine method may be used as a method for manufacturing titanium oxide, but the chlorine method is more preferable. Also, it is preferable not to use sulfuric acid in the manufacturing process. In addition, although the surface treatment of the titanium oxide is not particularly limited, it is preferable that during neutralization the titanium oxide is acid-treated titanium oxide other than sulfuric acid such as hydrochloric acid, nitric acid, phosphoric acid, acetic acid, and the like.

The titanium oxide may be any titanium oxide having any structure among a rutile type and an anatase type ramsdellite type, and may be used alone or in combination of two or more. Among them, the ramsdellite-type titanium oxide may be obtained by performing ramsdellite-Type $Li_{0.5}TiO_2$ lithium oxide separation treatment.

Among the above, it is preferable to use rutile-type titanium oxide because it can further improve heat resistance, and it makes it difficult to cause discoloration due to light irradiation and deterioration in quality even in a strict use environment. In particular, heat resistance can be improved by using rutile-type titanium oxide that has been surface treated with aluminum oxide such as alumina. The content of rutile-type titanium oxide surface-treated with aluminum oxide in the total titanium oxide is preferably 35 mass % or more, more preferably 55 mass % or more, with an upper limit of not more than 100 mass %, that is, the entirety of the titanium oxide can be rutile-type titanium oxide surface treated with the aluminum oxide. Also, Since anatase titanium oxide has a lower hardness than rutile titanium oxide, when using anatase titanium oxide, the moldability of the composition is improved.

In the solder resist composition of the present invention, the mixing amount of the (B) inorganic filler is in the range of 30 to 70 mass %, preferably in the range of 40 to 60 mass %, and more preferably in the range of 40 to 50 mass % with respect to the total resin composition. When the content of the (B) inorganic filler is within the above range, it is advantageous for high reflection, and when it is less than the above range, the reflectance is lowered, and when it exceeds the above range, there is a risk of cracking.

In the inorganic filler, the titanium oxide has a sulfur concentration of 100 ppm or less, and more preferably 50 ppm or less. In addition, titanium oxide of a commercial product having a sulfur concentration of 100 ppm or less may be used, and titanium oxide of a commercial product having a sulfur concentration of 100 ppm or more may be heat-treated, chemically treated, or refined such as washing, firing, or the like, to reduce the sulfur concentration and mix. Here, the sulfur contained in the titanium oxide refers to all sulfur detected by analysis. Sulfur adsorbed on titanium oxide and sulfur applied as impurities to titanium oxide are included.

In addition, the solder resist composition of the present invention may contain titanium oxide having a sulfur concentration of 100 ppm or more, within a range that does not impair the effects of the present invention. Examples of the titanium oxide having a sulfur concentration of 100 ppm or more may include CR-58, CR-90, R-630 by ISHIHARA SANGYO KAISHA, LTD., R-21 by Sakai Chemical Co., Ltd., and the like.

In addition, T-550, T-580, R-630, R-820, CR-50, CR-60, R-90, and CR-97 of ISHIHARA SANGYO KAISHA, LTD., which is rutile-type chlorine-based titanium oxide, or Ti PURE R-706, R-902+, which is manufactured by DuPont, or TR-600, TR-700, and TR-840, which are manufactured by Fuji Titanium Industries Co., Ltd., or KR-270, KR-310, and KR-380, which are manufactured by TiN Industries Co., Ltd., may be used.

When the particle size of titanium oxide is too small, fluidity deteriorates, and when the particle size is too large, insertion into a small diameter of the substrate deteriorates. Considering these, the median particle size of titanium oxide is in the range of 0.1 to 5 μm, preferably in the range of 0.1 to 1 μm, more preferably in the range of 0.1 to 0.5 μm, and most preferably 0.36 μm. When the particle size of titanium oxide is within the above range, there is an effect on high reflectance. The particle size above was measured using a laser diffraction method.

(B) Among the inorganic fillers, barium sulfate may be precipitated barium sulfate #100, precipitated barium sulfate #300, precipitated barium sulfate SS-50, BARIACE B-30, BARIACE B-31, BARIACE B-32, BARIACE B-33, BARIACE B-34, BARIFINE BF-1, BARIFINE BF-10, BARIFINE BF-20, BARIFINE BF-40 (manufactured by Sakai Chemical Industry Co., Ltd.), W-1, W-6, W-10, C300 (manufactured by Takehara Kagaku Kogyo Co., Ltd.), and the like.

The silica particles of the inorganic filler (B) are not particularly limited, and may be obtained by a method known to the skilled person in the art; for example, it can be manufactured by burning silicon powder by a Vaporized Metal Combustion (VMC) method. The VMC method is a method of obtaining oxide particles by forming a chemical salt by a burner in an atmosphere containing oxygen, injecting a metal powder constituting a part of target oxide particles in the chemical salt in an amount sufficient to form dust cloud, and causing knocking. Examples of commercially available silica include SO series made by Admatechs Co. Ltd., HPS series made by Toagosei Co., Ltd. (HPS-0500, HPS-1000, HPS3500, etc.), and the like.

(C) A Mercapto-Modified Acrylate

The solder resist composition of the present invention has enhanced surface hardening due to the use of the (C) mercapto-modified acrylate, resulting in improved gloss and high reflectance.

Furthermore, when the (C) mercapto-modified acrylate of the present invention is used in a solder resist composition with the (B) inorganic filler, the surface hardening of the solder resist layer is enhanced, and high reflectance and high gloss can be realized by the enhanced surface hardening.

The (C) mercapto-modified acrylate of the present invention is preferably a mono- or polyfunctional acrylate compound, and more preferred are aliphatic compounds with carbon number 1 to 15 substituted with at least one functional group selected from the group consisting of acryloyloxy, acryloyoxy, and acryloxyalkyl groups. Examples include pentanetriacrylate and the like.

The mercapto-modified acrylate (C) of the present invention is curable, preferably active energy ray-curable, and the mercapto-modified acrylate of the present invention can be obtained by a Michael addition reaction of a mercapto-modified (meth)acrylate polyfunctional thiol compound and a stoichiometrically excessive difunctional or more polyfunctional (meth)acrylate compound. Preferred polyfunctional thiol compounds include a multi-functional thiol compound of a reaction product of polyisocyanates, such as pentaerythritol tetrakis(3-mercaptopropionate) (molecular weight 489 g/mol), trimethylolpropane tris (3-mercaptopropionate) (molecular weight 399 g/mol), 1,3-bis(2-isocyanato-2-propyl) benzenetetrathiol, and a multi-functional thiol compound such as trimethylolpropane tris (3-mercaptopropionate), a multi-functional thiol compound of a reaction product of a polyisocyanate such as isophorone diisocyanate and a multi-functional thiol compound such as trimethylolpropane tris(3-mercaptopropionate), a multi-functional thiol compound of a reaction product of a polyisocyanate such as hexamethylenediisocyanate and a multi-functional thiol compound such as trimethylolpropane tris (3-mercaptopropionate), 1,6-hexanedithiol (molecular weight 150 g/mol), ethylene glycol di-2-mercaptoacetate (molecular weight 210 g/mol), penta erythritoltetrakis(2-mercaptoacetate) (molecular weight 433 g/mol), trimethylolpropane tris(2-mercaptoacetate), ethylene glycol bis(3-mercaptopropionate (molecular weight 238 g/mol), and the like. It is preferable that the mercapto-modified acrylic rate comprises two or more mercapto groups. Most preferably, it is most preferred that at least three mercapto groups are included. The mercapto-modified (meth)acrylate is preferably contained in an amount of 1-20% by mass, more preferably 1-10% by mass, and most preferably 1-7% by mass, among the (C) mercapto-modified acrylate components. In addition, the mercapto-modified amount is preferably 5,000 or less, more preferably 3,000 or less, and it would be more preferable if it is 2,000 or less. If the weight average molecular weight exceeds 5,000, the mobility of a mercapto-modified (meth)acrylate molecule is lowered, thereby deteriorating the reactivity of the formation of the active energy ray-curable coating film of the present invention. For example, when the coating film is cured with UV-LED, the tacky property of the surface of the cured coating film is increased, and there is a high possibility that when a printed material is put on it, it will stick.

For the (C) mercapto-modified acrylate, mercapto-modified acrylates are most preferred.

The mixing amount of (C) mercapto modified acrylate is in the range of 2-6% by mass with respect to the total resin composition. In this case, the (C) mercapto-modified acrylate is a pure monomer (solid content). The resin composition includes a solid and a solvent. When the content of (C) mercapto-modified acrylate is within the above range, the surface hardening is strengthened, gloss is improved, high reflectance is possible, and the decrease in reflectance is reduced even after the manufacturing process. Further, crack resistance is improved. When the content of (C) mercapto-modified acrylate is less than the above range, gloss is reduced due to surface hardening deterioration and it is impossible to achieve high reflectance. When the content of (C) mercapto-modified acrylate exceeds the above-described range, breakability of the coating film may be increased and resolution thereof may be decreased due to the surface overcuring.

(D) Resin Containing an Aromatic Ring (D) resin containing the aromatic ring of the present invention is a resin with excellent resistance to yellowing compared to resins known in the prior art. The solder resist composition of the present invention is excellent in yellowing resistance thanks to including (D) the resin containing the aromatic ring.

(D) resin containing the aromatic ring of the present invention can be a resin that has electrically insulating properties when cured by heating, and those containing aromatic rings are preferred.

For the (D) resin containing an aromatic ring in the solder resist composition of the present invention, a melamine resin, a silicone resin, a resin having a styrene skeleton, and the like can be used, and among the above, a resin having a styrene skeleton is most preferred.

Also, preferably, the (D) resin containing an aromatic ring may contain a carboxyl group, and it is more preferable to use a carboxyl group-containing resin having a styrene skeleton, and a mixture of carboxyl group-containing resins other than a carboxyl group-containing resin having a styrene skeleton may be used.

When the (D) resin containing the aromatic ring is a carboxyl group-containing resin having a styrene skeleton, it does not have photosensitive groups such as ethylenically unsaturated bonds having carboxyl groups in the molecule, but has a styrene skeleton, an average molecular weight of 10,000 to 50,000, and an acid value of 80 to 200 mgKOH/g. Carboxyl group-containing resins having such a styrene skeleton can be synthesized by copolymerizing styrene with an essential monomer. By utilizing a carboxyl group-containing resin with related properties, the cured film comprising the photosensitive resin composition of the present invention has excellent dry to touch property and anti-flow effects.

Specific examples of carboxyl group-containing resins having a styrene skeleton include, for example, carboxyl group-containing resins (whether oligomers or polymers) obtained by copolymerization of an unsaturated carboxylic acid, such as (meth)acrylic acid, with a compound containing an unsaturated group selected from styrene, α-methylstyrene, low-grade alkyl (meth)acrylates, isobutylene, and the like. Furthermore, an alkyl group refers to an alkyl group having a carbon atom number of 1 to 5.

The average molecular weight per weight of the carboxyl group-containing resin having a styrene skeleton in the solder resist composition of the present invention varies depending on the resin skeleton, but the anti-flow effect is improved in the range of 10,000 to 50,000. Preferably, it is 10,000 to 25,000, more preferably 10,000 to 20,000, and even more preferably 10,000 to 17,000. By having a weight average molecular weight of 10,000 or more, not only the anti-flow effect is improved, but also the dry to touch property (tackiness) is improved, and the moisture resistance of the exposed coating film is improved, and the reduction of the film at the time of development is suppressed, and the deterioration of the resolution is suppressed. In addition, by reducing the weight average molecular weight to 50,000 or less, not only the anti-flow effect is improved, but also the developability is improved and the storage stability is improved.

In the solder resist composition of the present invention, the acid value of the carboxyl group-containing resin having a styrene skeleton is 80~200 mgKOH/g, more preferably, 100~160 mgKOH/g. When the acid value of the carboxyl group-containing resin having a styrene skeleton is 80 mgKOH/g or more, the softening point is increased, and thus tacky property and developability are increased. Meanwhile, when the acid value of the carboxyl group-containing resin having a styrene skeleton is set to 200 mgKOH/g or less, stress is not generated during curing due to an appropriate crosslinking density, and a coating film can be satisfactorily obtained.

A carboxyl group-containing resin with a styrene skeleton in the solder resist composition of the present invention, despite containing an aromatic ring, suppresses discoloration and decrease in reflectance in a cured product when subject to light irradiation or heat and shows excellent developability and dry to touch property, thanks to the styrene skeleton. It is preferable that the ratio of the styrene skeleton in the molecule is 10~80 mol %, more preferable that it is 10~60 mol %, and most preferable when 10~50 mol %. That is, when synthesizing the carboxyl group-containing resin having a styrene skeleton, it is preferable to use 30~60 mol % of styrene based on the total amount of the monomer. When the ratio of the styrene skeleton of the carboxyl group-containing resin is 10 mol % or more in the molecule, compatibility with other components is improved, and when the ratio is 80 mol % or less in the molecule, developability is improved.

The carboxyl group-containing resin with a styrene skeleton is prepared by suspension polymerization to become a high molecular weight resin. Consequently, it can be said that the composition using the resin is preferable in that it shows excellent dry to touch property (tackiness). In general, when a carboxyl group-containing resin having a styrene skeleton is prepared by suspension polymerization, the resin has a high molecular weight, but considering characteristics such as screen printing compatibility, dry to touch property, developability, and the like, it is necessary to limit the weight average molecular weight to a range of 10,000 to 50,000. Accordingly, in controlling the molecular weight, it is preferable to use a chain transfer agent during synthesis of a carboxyl group-containing resin having a styrene skeleton.

In addition, it is preferable to use a polymerization initiator in synthesizing a carboxyl group-containing resin having a styrene skeleton in order to promote polymerization. Examples of the polymerization initiator include BPO (benzoyl peroxide), t-butylperoxy-2-ethylhexanoate, AMBN (2,2'-azo bis(2-methylbutyronitrile)), and the like. Among them, BPO (benzoyl peroxide) is preferred. The mixing amount of the polymerization initiator is preferably 0.1 to 10% by mass, more preferably 0.1 to 6% by mass, in terms of solid content, based on 100% by mass of the carboxyl group-containing resin having a styrene skeleton.

The formulation amount of (D) resin containing an aromatic ring is in the range of 0.1 to 15% by mass based on the total weight of the resin composition, preferably in the range of 1 to 10% by mass, and more preferably in the range of 3 to 6 mass %. The resin composition includes a solid and a solvent.

When the content of the resin containing the aromatic ring is less than the above range, the reflectance of the resin composition is lowered, and discoloration due to yellowing becomes severe. When the content of (D) resin containing an aromatic ring exceeds the above range, the dry to touch property is increased. When within the above range, decrease in reflectance and discoloration can be suppressed, and developability and dry to touch property are excellent. In the above range, it is possible to improve high reflectance and yellowing problems.

(E) Silane Coupling Agent

By comprising (E) silane coupling agent, the solder resist composition of the present invention can achieve improved crack resistance, reflectance, and gloss.

The (E) silane coupling agent of the present invention may have an organic group such as a vinyl group, a styrene group, an acryl group, a methacryl group, an isocyanurate group, an acid anhydride group, a ureide group, an epoxy group, an amino group, a methacryloxy group, a mercapto group, an isocyanate group, etc.

The silane coupling agent having a vinyl group may include vinyltrimethoxysilane and vinyltriethoxysilane. The silane coupling agent with a styrene group may include p-styryl methoxysilane. The silane coupling agent having a methacrylic group may include 3-methacryloxypropylmethyldimethoxysilane, 3-methacryloxypropyltrimethoxy silane, 3-methacryloxypropyldiethoxysilane, 3-methacryloxypropyltriethoxysilane, and the like. The silane coupling agent with an acrylic group may be 3-acryloxypropyl trimethoxysilane. The silane coupling agent having an amino group may include N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxy-silyl-N-(1,3-dimethyl-butylidene) propylamine, N-phenyl-3-aminopropyl trimethoxysilane, N-(vinylbenzyl)-2-aminoethyl-3-aminopropyltrimethoxysilane, and the like. Examples of the silane coupling agent having a mercapto group include 3-mercaptopropylmethyldimethoxysilane and 3-mercaptopropyltrimethoxysilane.

The silane coupling agent with an isocyanate group may be 3-isocyanate propyltriethoxysilane. Examples of the silane coupling agent with an isocyanurate group include tris-(trimethoxysilylpropyl)isocyanurate. The silane coupling agent with a ureide group may be 3-ureidopropyltrialkoxy silane. Examples of the silane coupling agent with an acid anhydride group include 3-(trimethoxysilyl)propylsuccinic anhydride. Among the silane coupling agents, a silane coupling agent having an epoxy group is most preferred. For example, 2-(3,4-epoxycyclohexyl)ethyltrimethoxysilane, 3-glycidoxypropylmethyldimethoxysilane, 3-glycidoxy propyltrimethoxysilane, 3-glycidoxypropyl methyldiethoxysilane, 3-glycidoxypropyltriethoxysilane, and the like may be mentioned. Among them, 3-glycidoxypropyltriethoxysilane is most preferred.

(E) silane coupling agent in the solder resist composition of the present invention is in the range of 0.1 to 5 mass %, preferably in the range of 0.3 to 3 mass %, more preferably in the range of 0.5 to 2 mass %, based on the total weight of the composition. The resin composition includes a solid and a solvent. When the content of the (E) silane coupling agent is within the above range, the resin composition has excellent crack resistance and high reflectance. When the content of the (E) silane coupling agent is less than 0.1% by mass, cracks may occur as well as problems with adhesion, and when the content is more than 5% by mass, the tacky property becomes severe and the film formation is not well performed.

For (E) silane coupling agent may be used a commercial product, and examples thereof may include KBM-1003, KBE-1003, KBM-303, KBM-402, KBM-403, KBE-402 and KBE-403, KBM-1403, KBM-502, KBM-503, KBE-502, KBE-503, KBM5103, KBM-602, KBM-603, KBM-903, KBE-903, KBE-9103P, KBM-573, KBM-573, KBM-575, KBM-9659, KBM-585A, KBM-802, KBM-803, KBE-9007N, X-12-967C, and the like of Shin-Etsu Kagaku Kogyo Kabushikigeisha.

(F) Resin with a Urethane Bond (F) resin with urethane bond of the present invention is a resin having excellent flexibility.

The solder resist composition of the present invention is capable of performing lamination work with a uniform thickness without being broken even on a flexible substrate or a thin plate by using a resin having a urethane bond, and has excellent resistance to cracks or breakage when external impact or bending is applied. Therefore, the solder resist composition of the present invention is superior in flexibility and crack resistance compared with other ink or solder resist compositions.

(F) resin with a urethane bond of the present invention may include a modified urethane resin, and the resin having a urethane bond may be ester type urethane-based, ether type urethane-based, modified urethane acrylate-based, modified urethane epoxy, silicone modified urethane, fluorine-based modified urethane, and the like, and more preferably, a modified urethane epoxy acrylate containing an epoxy group may be used.

As the resin with a urethane bond, a known compound having a urethane bond may be used. For example, isocyanate compounds (e.g., mono isocyanate, diisocyanate, polyisocyanate) and compounds having an OH group (e.g., polyhydric alcohols such as monohydric alcohols, polyester polyols, polyether polyols, etc., epoxy (meth)acrylates) and reaction products may also include such modifications.

In the present invention, the compound having a urethane bond is preferably an epoxy group having a carboxyl group, preferably a (meth)acryloyl group, and examples thereof include the following carboxyl group-containing resin (1), epoxy group-containing resin (2), (meth)acryloyl group-containing resin (3), (4), (5). In addition, as shown in the following examples, one resin may have at least two of a carboxyl group, an epoxy group, and a methacryloyl group.

(1) a carboxyl group-containing photosensitive polyurethane resin by a polyaddition reaction of a reactant of diisocyanate and a monocarboxylic acid compound having an ethylene-based unsaturated double bond, such as a bifunctional epoxy resin (meth)acrylate, such as a bisphenol A type epoxy resin, a hydrogenated bisphenol A type epoxy resin, a bisphenol F type epoxy resin, a bisphenol S type epoxy resin, a bisilenol epoxy resin, a phenol type epoxy resin, and the like, partial anhydrides thereof, or modifications thereof, a carboxyl group-containing dialcohol compound, and a diol compound.

(2) a urethane-modified epoxy resin having a urethane bond and two or more epoxies in a molecule obtained by reacting a hydroxyl group-containing epoxy compound with a urethane bond-containing compound having an isocyanate group obtained by reacting a polyhydroxy compound with a polyisocyanate compound.

(3) a urethane resin by a polyaddition reaction of a diisocyanate such as aliphatic diisocyanate, branched chain diisocyanate, alicyclic diisocyanate, or aromatic diisocyanate with a diol compound such as polycarbonate-based polyol, polyether-based polyol, polyester-based polyol, polyolefin polyol, acryl polyol, an epoxy resin having a hydroxyl group (thus, a urethane resin having an epoxy group can be obtained), bisphenol A-based alkylene oxide adduct diol, a compound having a phenolic hydroxyl group and an alcoholic hydroxyl group.

(4) a photosensitive polyurethane resin obtained by a polyaddition reaction of the isocyanate and the diol compound, wherein part or all of the diisocyanate in the above reaction (3) is replaced with a reaction product of isophorone diisocyanate and pentaerythritol triacrylate, a compound having one isocyanate group and one or more (meth)acryloyl groups in the molecule.

(5) A terminal (meth)acrylated photosensitive polyurethane resin prepared by adding a compound having one hydroxyl group and one or more (meth)acrylics in a molecule such as a hydroxyalkyl(meth)acrylate during the synthesis of one of the resins (3) and (4).

Among the resins with urethane bond, it is preferable that it is (1) among carboxyl group-containing resins, (2) among epoxy group-containing resins, and (5) among (meth)acryloyl group-containing resins.

As for the diisocyanate, for example, an aromatic polyisocyanate, an aliphatic polyisocyanate or an alicyclic polyisocyanate is used. Examples of the aromatic polyisocyanate include 4,4'-diphenylmethane diisocyanate, 2,4-diisocyanate-2,6-tolylene diisocyanate, naphthalene-1,5-diisocyanate-o-xylene diisocyanate, m-xylene diisocyanate, 2,4-triene dimer, and the like. Examples of aliphatic polyisocyanates include tetramethylene diisocyanate, hexamethylene diisocyanate, methylene diisocyanate, methylene diisocyanate, trimethylhexamethylene diisocyanate, 4,4-methylenebis(cyclohexyl isocyanate), and isophorone diisocyanate can be mentioned. Examples of the alicyclic polyisocyanate include bicycloheptane triisocyanate. Among these, aliphatic isocyanate is most preferred.

When the (F) compound having a urethane bond is a carboxyl group-containing resin having a urethane bond, the acid value of the carboxyl group-containing resin is preferably in the range of 40-200 mgKOH/g, and more preferably in the range of 45-120 mgKOH/g. In the range of 40 mgKOH/g to 200 mgKOH/g, the adhesive property of the cured film is obtained to facilitate alkali development, and thus the dissolution of the exposed part by the developing solution is suppressed, such that the line is not narrowed more than necessary and normal resist pattern drawing is facilitated.

When the (F) compound having a urethane bond is a carboxyl group-containing resin having a urethane bond, the weight average molecular weight of the carboxyl group-containing resin varies depending on the resin skeleton, but when the weight average molecular weight is generally in the range of 2,000 to 150,000, preferably in the range of 5,000 to 50,000, and more preferably in the range of 2,000 to 50,000, the performance of tacky property is good; the moisture resistance of the cured film is good; and the coating film is not easily reduced during development. In addition, when in the range of the weight average molecular weight, resolution and developability are good and storage stability is improved.

The carboxyl group-containing resin having a urethane bond is preferably UXE-3000 (Japan Explosives Co., Ltd.), EPU-7N (urethane modified epoxy resin; ADEKA Co., Ltd.) as examples of a commercially available resin having a urethane bond. Among these, Ebecryl 210 (aromatic urethane acrylate; Daicel Allnex Co., Ltd.) is most preferred. The mixing amount of the resin is in the range of 0.1 to 15% by mass, preferably in the range of 5 to 13% by mass, more preferably in the range of 8 to 11% by mass, based on the total amount of the resin composition. The resin composition includes a solid and a solvent. When the content of the (F) resin having the urethane bond is within the above range, flexibility and crack resistance of the resin composition are excellent. When the content of the (F) resin having the urethane bond is less than the above range, problems of cracks and flexibility may occur, and when the content of the urethane resin exceeds the above range, Tacky property may be severe, and printing property and drying property may be problematic. In the solder resist resin composition of the present invention, the weight average molecular weight of (F) resin having the urethane bond is in the range of 1,000 to 50,000, preferably 6,000 to 30,000. When the weight average molecular weight of the (F) resin having a urethane bond is within the above range, there is an effect on crack resistance and flexibility.

Other Optional Ingredients

In the solder resist composition of the present invention, various additives can be added, if necessary. Specifically, a heat curing catalyst, a dispersant, an antioxidant, a photopolymerization initiator, a colorant, a thermosetting resin, an acrylic resin, various other additives, or a mixture of two or more thereof may be added. As for the other optional components, one or more of the following materials may be contained.

<Photopolymerization Initiator>

In the solder resist composition of the present invention, when a photocurable resin is used, it is preferable to add a photopolymerization initiator. As for the photopolymerization initiator, any known photopolymerization initiators listed in the disclosure can be used as photopolymerization initiators and photoradical generators.

Examples of the photopolymerization initiator include bis-(2,6-dichlorobenzoyl)phenyl phosphine oxide, bis-(2,6-dichlorobenzoyl)-2,5-dimethylphenylphosphine oxide, bis-(2,6-dichlorobenzoyl)-4-propylphenylphosphine oxide, bis-(2,6-dichlorobenzoyl)-1-naphthylphosphine oxide, bis-(2,6-dimethoxybenzoyl)phenylphosphine oxide, bis-(2,6-dimethoxybenzoyl)-2,4',4"-trimethylpentylphosphine oxide, bis-(2,6-dimethoxybenzoyl)-2,5-dimethylphenylphosphine oxide, bis-(2,4,6-trimethyl benzoyl)-phenylphosphine oxide (BASF Japan Co., Ltd., IRGACURE 819), and the like; bis acylphos pin oxides, such as 2,6-dimethoxybenzoyl diphenylphosphine oxide, 2,6-dichlorobenzoyl diphenylphosphine oxide, 2,4,6-trimethylbenzoyl phenylphosphinic acid methyl ester, 2-methyl benzoyl diphenylphosphine hydroxycyclohexylphenylketone, 1-4-(2-hydroxy ethoxy)-phenyl]-2-hydroxy-2-methyl-1-propan-1-one, 2-hydroxy-1-{4-[4-(2-hydroxy-2-methyl-propionyl)-benzyl]phenyl}-2-methyl-propan-1-one, 2-hydroxy-2-methyl-1-one, 2-hydroxy-2-methyl-1-phenylpropan-1-one, etc.; benzoines such as benzoin, benzyl benzoinmethyl ether, benzoinethyl ether, benzo-n-propyl ether, benzoinisopropyl ether, benzo-n-butyl ether, etc.; benzoin alkyl ethers; benzophenones such as benzophenone, p-methylbenzophenone, michirazketon-methylbenzophenone, 4,4'-dichlorobenzophenone, 4,4'-bis-diethylaminobenzophenone, etc.; benzophenones such as acephenone, 2,2-methoxy-2-phenylacetophenone, 2,2'-diethoxy-2-phenyl acetophenone, 1,1'-1,2-(dimethylamino)-2-[(4-methylphenyl)methyl)-1-[4-(4-moruhorinir)phenyl]-1-butanone, acetophenone such as N,N-dimethylaminoacetophenone, etc.; thioxanthones such as thioxanthone, 2-ethylthioxanthone, 2-isopropylthioxanthone, 2,4-dimethylthioxanthone, 2,4-diethyl thioxanthone, 2-chlorothioxanthone, 2,4-diisopropylthioxanthone, etc.; anthraquinones such as anthraquinone, chloroanthraquinone, 2-methylanthraquinone, 2-ethyl anthraquinone, 2-tert-butylanthraquinone, 1-chloroanthraquinone, 2-amylanthraquinone, 2-aminoanthraquinone, etc.; ketals such as acetophenone dimethylketal, benzyl dimethylketal, etc acetophenone-4-dimethylaminobenzoate, 2-(dimethylamino)ethylbenzoate, p-dimethylbenzoic acid ethylester, etc.; 1, Examples of the ester may include oxime esters such as oxime; titanocenes such as bis(η-5-2,4-cyclopentadiene-1-yl)-bis(2,6-difluoro-3-(1H-pyrrol-1-yl)phenyl)titanium, bis(cyclopentadienyl)-bis[2,6-difluoro-3-(2-(1-fill-1-yl) ethyl)phenyl]titanium; phenyl disulfide 2-nitrofluorene, butyrosin, anisoin ethyl ether, azobisisobutyronitrile, and tetramethyltoumide. The photopolymerization initiators described above may be used individually by 1 type, and may be used in combination of 2 or more types.

Among the above, the acylphosphine oxide-based photopolymerization initiators such as bis-acylphosphine oxides and monoacylphosphine oxides are preferred because they are less sticky and have excellent discoloration-inhibiting effects. In particular, the use of bisacylphosphine oxides is preferable in that it can further improve sensitivity and get rid of stickiness.

The amount of the photopolymerization initiator is 0.01 to 10% by mass based on the total amount of the composition. It is preferable to have it be 0.01 to 7% by mass, and more preferable to have it be 0.01 to 5% by mass. When the initiator is mixed in this range, the curability of the coating film, coating properties such as chemical resistance, and deep curability are improved, because photocurability in copper is sufficient.

For the photopolymerization initiators used in the photopolymerization initiators in the solder resist composition of the present invention, an oxime ester, a phosphine oxide-based, an acetophenone-based, or a benzoic acid ester-based photopolymerization initiator are preferred. More preferable are an oxime ester and phosphine oxide-based initiator.

When the amount of the photopolymerization initiator is within the range, an undercut isn't severe and it has excellent resolution. When the content of the photopolymerization initiator is less than the mass range given above, the coating film is uncured or the undercut is severe, and core curing is not performed. In addition, when the content of the photopolymerization initiator exceeds the range given above, a halation phenomenon at the upper portion may be severe, thus rendering the resolution to be poor.

<Thermosetting Resin>

The thermosetting resin of the present invention can be any resin that is cured by heating and exhibits electrical insulating properties. Examples include epoxy resins, oxetane compounds, melamine resins, silicone resins, and the like. In particular, epoxy resins or octane compounds are particularly suitable for use in the present invention, and they can be used in combination.

As for the epoxy resin, a known and commonly used compound having one or more epoxy groups may be used. Among them, a compound having two or more epoxy groups is preferable. For example, the monoepoxy compound may include a monoepoxy compound such as a monoepoxy compound such as butyl glycidyl ether, phenyl glycidyl ether, glycidyl (meth)acrylate, or the like, a compound having two or more epoxy groups in one molecule such as a bisphenol A type epoxy resin, a bisphenol S type epoxy resin, a bisphenol F type epoxy resin, a phenol novolac type epoxy resin, a cresol novolac type epoxy resin, an aliphatic ring epoxy resin, trimethylolpropane polyglycidyl ether, phenyl-1,3-diglycidyl ether, biphenyl-4,4'-diglycidyl ether, 1,6-hexanediol diglycidyl ether, diglycidyl ether of ethylene glycol or propylene glycol, sorbitol polyglycidyl ether, tris(2,3-epoxypropyl)isocyanurate, or triglycidyl tris(2-hydroxyethyl)isocyanurate. These may be used alone or in a combination of two or more according to the required characteristics.

Examples of the compound having two or more epoxy groups include the following but are not limited to: jER828, jER834, jER1001, and jER1004 manufactured by Mitsubishi Chemical Co., Ltd., EPICLON 840, EPICLON 850, EPICLON 1050, EPICLON 2055 manufactured by DIC Co., Ltd., Epototo D-011, YD-013, YD127, and YD-128 manufactured by Nippon Steel Chemical Co., Ltd., D.E.R.317, D.E.R.331, D.E.R.661, and D.E.R.664 manufactured by Dow Chemical Japan Co., Ltd., Sumi Epoxy ESA-011, ESA-014, ELA-115, and ELA128 manufactured by Sumitomo Chemical Co., Ltd., bisphenol A type epoxy resin such as A.E.R.330, A.E.R.331, and A.E.R.661, A.E.R.664 (all trade names) manufactured by Asahi Kasei Materials Co., Ltd., jERYL903 by Mitsubishi Chemical Co., Ltd., EPICLON 152, EPICLON 165 manufactured by DIC Co., Ltd., YDE-400, YDE-500 by Nippon Steel Chemical Co., Ltd., D.E.R.542 manufactured by Dow Chemical Japan Co., Ltd., Sumitoepoxy ESB-400, ESB-700 of Sumitomo Chemical Co., Ltd., brominated epoxy resin such as A.E.R.711, A.E.R.714, etc. (all trade names) by Asahi Kasei Materials, jER152, jER154 by Mitsubishi Chemical Co., Ltd., D.E.N.431, D.E.N.438, by Dow Chemical Japan Co., Ltd., EPICLON N-730, EPICLON N-770, EPICLON N-865, by DIC Co., Ltd., YDC-701, YDC-704 of Nippon Steel Chemical Co., Ltd., EPPN-201, EPPN-1025, EPPN-1020, EPPN-1045, RE-306, NC-3000 of Japan Chemical, Co., Ltd., Sumi Epoxy ESCN-195X, ESCN-220 by Sumitomo Chemical Co., Ltd., A.E.R.ECN-235, ECN-299 of Asahi Kasei Materials Co., Ltd., YDCN-700-2, YDCN-700-3, YDCN-700-5, YDCN-700-7, YDCN-700-10, YDCN-704, YDCN-704A by Nippon Steel Chemical Co., Ltd., novolac epoxy resin such as EPICLON N-680, N-690, N-695(all trade names) of DIC Co., Ltd., EPICLON 830 of DIC Co., Ltd., jER807 of Mitsumi Chemical Co., Ltd., bisphenol F-type epoxy resins such as YDF-175, YDF-2004 (all tradenames) of Nippon Steel Chemical Co., Ltd., hydrogenated bisphenol A type epoxy resin such as ST-2004, ST-2007, ST-3000 (trade names) of Nippon Steel Chemical Co., Ltd., jER 604 of Mitsumi Chemical Co., Ltd., Ephotouto YH-434 of Nippon Steel Chemical Co., Ltd., a glycidyl amine-type epoxy resin such as Sumi Epoxy ELM-120, etc., (all trade names) of Sumitomo Chemical Co., Ltd.; hydantoin epoxy resins; alicyclic epoxy resins such as Celloxide 2021 (all trade names) from Daicel Co., Ltd.; trihydroxyphenyl methane epoxy resins such as YL-933 from Mitsubishi Chemical Co., Ltd. and T.E.N., EPPN-501, EPPN-502, and the like (all trade names) from Dow Chemical Japan Co., Ltd.; bisilenol or biphenol epoxy resins such as YL-6056, YX-4000, YL-6121 (all trade names) from Mitsubishi Chemical Co., Ltd. or mixtures thereof; bisphenol S epoxy resins such as EBPS-200 from Kayaku Co., Ltd., EPX-30 by ADEKA, EXA-1514 (trade names) from DIC Co., Ltd.; bisphenol A novolac epoxy resins such as jER 157S (trade names) from Mitsubishi Chemical Co., Ltd.; a tetraphenylethane epoxy resin such as jER YL-931 (all trade names) of Mitsubishi Chemical Co., Ltd.; heterocyclic epoxy resins such as TEPIC (all trade names) of Nissan Chemical Co., Ltd.; diglycidyl phthalate resins such as Brenmer DGT of Niche Oil Co., Ltd.; tetraglycidyl kylenoylethane resins such as ZX-1063 of Nippon Steel Chemical Co., Ltd.; naphthalene-containing epoxy resins such as ESN-190, ESN-360 of Nippon Steel Chemical Co., Ltd., and HP-4032, EXA-4750, EXA-4700 of DIC Co., Ltd.; epoxy resins having dicyclopentadiene skeleton such as HP-7200, HP-7200H of DIC Co., Ltd.; glycidyl methacrylate copolymer epoxy resins such as CP-505, CP-50M of Niche Oil Co., Ltd.; copolymerized epoxy resins of cyclohexylmaleimide and glycidyl methacrylate; CTBN modified epoxy resins such as YR-102, YR-450 of Nippon Steel Chemical Co., Ltd., and the like. Among these, a bisphenol A type epoxy resin, a heterocyclic epoxy resin or a mixture thereof is preferred over a resin having excellent discoloration resistance. These epoxy resins may be used individually by 1 type, or may be used in combination of 2 or more types.

Next, the oxetane compound will be described. General Formula (I)

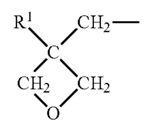

(1)

As a specific example of the oxetane compound containing an oxetane ring represented by the above formula (wherein $R^1$ represents a hydrogen atom or an alkyl group having 1 to 6 carbon atoms), 3-ethyl-3-hydroxymethyloxetane (DongA Synthetic Co., Ltd., trade name O X T-1 0 1), 3-ethyl-3-(phenoxymethyl)oxetane (DongA Synthetic Co., Ltd., trade name O X T-211), 3-ethyl-3-(2-ethyl hexyloxymethyl)oxetane (DongA Synthetic Co., Ltd., trade name O X T-212), 1,4-bis {[(3-ethyl-3-ocycetaniru)methoxy] methyl}benzene (DongA Synthetic Co., Ltd., trade name O X T-1 2 1), bis(3-ethyl-3-oxetanylmethyl)ether (DongA Synthetic Co., Ltd., trade name O X T-2 1), etc. Also, a phenol novolac type oxetane compound and the like can be mentioned. Such oxetane compounds may be used in combination with the epoxy resin, or may be used alone.

In the solder resist composition of the present invention, the epoxy resin is preferably a bisphenol-based epoxy resin. Preferably, an epoxy resin having two or more epoxy groups in the bisphenol epoxy series is most preferred. The amount of the bisphenol-based epoxy resin having two or more epoxy groups used in the present invention is in the range of 1 to 15% by mass, preferably in the range of 1 to 10% by mass, and more preferably in the range of 3 to 10% by mass, based on the total weight of the resin composition. The resin composition includes a solid and a solvent. In the solder resist resin composition of the present invention, the weight average molecular weight of the resin is preferably in the range of 150 to 100,000.

When the content of the epoxy resin is within the above range, the adhesive strength of the resin composition and heat resistance thereof are excellent. When the content of the epoxy resin is less than the above range, the coating film is not cured, and problems may occur in adhesion of the coating film and pencil hardness. When the epoxy resin exceeds the range, yellowing becomes severe, and high reflectance cannot be achieved after the process.

An equivalent ratio (an epoxy group/carboxyl group equivalent ratio) obtained by dividing an epoxy group equivalent weight included in the epoxy resin by a carboxyl group equivalent weight included in (A) the carboxyl group-containing resin without the aromatic ring component may be 0.5 or more and 1.2 or less.

The epoxy group/carboxyl group equivalent ratio refers to a ratio obtained by dividing the equivalent of the epoxy group included in the epoxy resin of the solid content conversion composition by the equivalent of the carboxyl group included in the carboxyl group-containing resin:

Epoxy Group Equivalent: Mass of Solids of Epoxy Resin/Epoxy Group Equivalent of Solids Carboxyl Group Equivalent: Weight of solids of carboxyl group-containing resin/Carboxyl Group Equivalent of solids In a general solder resist composition, the curing density of solder resists varies depending on the epoxy group/carboxyl group equivalent ratio, and there are differences in HAST resistance, reflectance after HAST, solder heat resistance, adhesion, developability, solvent resistance, crack resistance, and the like, according to the ratio of the equivalent of epoxy group/carboxyl group. When the equivalent ratio of the epoxy group/carboxyl group is 0.5 or less, the curing density is relatively low, and when the equivalent ratio of the epoxy group/carboxyl group is more than 1.2, the curing density is relatively high; thus when the equivalent ratio is within 0.5 to 1.2, excellent resistance of the HAST, reflectance after HAST, developability, solvent resistance, adhesion, solder heat resistance, and the like, may be obtained.

Preferably, the solder resist composition may have an equivalent ratio (epoxy group/carboxyl group equivalent ratio) of 0.5 or more and 1.2 or less, which is obtained by dividing the epoxy group equivalent of the epoxy resin by the carboxyl group equivalent of the (A) carboxyl group-containing resin without the aromatic ring component, and may have a content of (C) mercapto-modified acrylate of 2 to 6% by mass with respect to the total composition. There may be a difference in the curing density and surface curability of the surface of the solder resist depending on whether the (C) mercapto-modified acrylate composition component is contained or not.

When the composition component (C) of the mercapto-modified acrylate has an epoxy group/carboxyl group equivalent ratio of 0.5 to 1.2, and 2 mass % to 6 mass % based on the total weight of the composition, the composition can have more excellent HAST resistance, reflectance after HAST, developability, solvent resistance, adhesion, solder heat resistance, and the like.

<Acryl Resin>

The acrylic resin is a photocurable resin. The photocurable resin may be a resin that is cured by active energy ray irradiation to exhibit electrical insulation, and particularly, in the present invention, a compound having at least one ethylenically unsaturated bond in a molecule is preferably used. As the compound having an ethylenically unsaturated bond, a commonly used photopolymerizable oligomer, a photopolymerizable monomer, a photopolymerizable vinyl monomer, and the like are used. Among them, the photopolymerizable oligomer may be an unsaturated polyester oligomer, a (meth)acrylate oligomer, and the like. Examples of the (meth)acrylate-based oligomer may include epoxy (meth)acrylate such as phenol novolac epoxy (meth)acrylate, cresol novolac epoxy (meth)acrylate, bisphenol-type epoxy (meth)acrylate, and the like, urethane (meth)acrylate, epoxy urethane (meth)acrylate, polyester (meth)acrylate, polyether (meth)acrylate, polybutadiene modified (meth) acrylate, and the like.

The photo-polymerizable monomer or the photo-polymerizable vinyl monomer may include: commonly used ones, for example, styrene derivatives such as styrene, chlorostyrene, α-methylstyrene, and the like; vinyl esters such as vinyl acetate, vinyl dropping vinyl, or vinyl benzoate; ethers such as vinyl isobutylether, vinyl-n-butylether, vinyl-t-butylether, vinyl-n-amyl ether, vinyl isoamyl ether, vinyl-n-octadecyl ether, vinyl cyclohexyl ether, ethylene glycol monobutylether, triethylene glycol monomethyl ether, and the like; (meth)acrylamides such as acrylamide, methacrylamide, N-hydroxymethylacrylamide, N-hydroxymethylmethacrylamide, N-methoxymethylacrylamide, N-ethoxymethyl acrylamide, N-butoxymethylacrylamide, and the like; aryl compounds such as triallyl isocyanurate phthalate phthalate giaru, isophthalic acid giaru, and the like; (meth) acrylic acid esters such as 2-ethylhexyl(meth)acrylate, lauryl (meth)acrylate, tetrahydrofurfuryl (meth)acrylate, isobornane(meth)acrylate, phenyl(meth)acrylate, phenoxyethyl (meth)acrylate, and the like; (meth)Examples of the polyacrylate may include alkylenepolyol poly(meth)acrylates such as butanediol di(meth)acrylates, neopentyl glycol di(meth)acrylate-1,6-hexanediol di(meth)acrylate, trimethylolpropane tri(meth)acrylate, pentaerythritol tetra(meth) acrylate, and dipentaerythritol hexa(meth)acrylate; polyoxyalkylene glycol poly(meth)acrylates such as diethylene glycol di(meth)acrylate, triethylene glycol di(meth)acrylate, ethoxylated trimethylolpropane triacrylate, and propoxylated trimethyl olpropane tri(meth)acrylate; poly(meth)acrylates such as hydroxypivalic acid neopentyl glycol ester di(meth)acrylate; isonalate poly(meth)acrylates such as tris [(meth)acryloyloxyethyl]isocyanurate, and the like. Depending on these required characteristics, it may be used alone or in combination of two or more.

In the solder resist composition of the present invention, the acrylate resin is preferably an unsaturated polyester oligomer, a (meth)acrylate oligomer, and the like. More preferably, a 6-functional flexible acrylic oligomer is most preferred. The mixing amount of the resin containing the acrylic resin is in the range of 1 to 15% by mass, preferably in the range of 1 to 10% by mass, more preferably in the range of 5 to 10% by mass, based on the total resin composition. The resin composition includes a solid and a solvent. When the mass ratio of the photopolymerizable acrylic resin composition is within the range, resolution and undercut are excellent. When the weight ratio of the photopolymerizable acrylic resin composition is less than the above range, the coating film may be uncured, and problems like undercut and uncuring of the coating film may occur. In addition, when the weight ratio of the acrylic resin composition exceeds the above range, the coating film may be broken due to over-curing of the coating film, and resolution may be poor.

<Thermal Curing Catalyst>

In the composition of the present invention, when a thermosetting resin is used, at least any one type of a curing agent and a curing catalyst may be further added.

The curing agent may include polyfunctional phenol compounds, polycarboxylic acids and acid anhydrides thereof, aliphatic or aromatic primary or secondary amines, polyamide resins, isocyanate compounds, polymercapto compounds, and the like. Among these, polyfunctional phenolic compounds, polycarboxylic acids and acid anhydrides thereof are preferably used considering its workability and insulation. As for the polyfunctional phenol compound, a compound with two or more phenolic hydroxyl groups in one molecule may be used, and a known and commonly used one may be used. Specifically, a phenol novolac resin, a cresol novolac resin, bisphenol A, allylated bisphenol A, bisphenol F, a novolac resin of bisphenol A, a vinylphenol copolymerized resin, and the like may be mentioned, and particularly bisphenol A is preferable because it has a high reactivity and can increase heat resistance. This polyfunctional phenolic compound undergoes an additional reaction in at least one of the epoxy compound and the octane compound in the presence of an appropriate curing catalyst. Examples of the polycarboxylic acid and the acid anhydride thereof include compounds having two or more carboxylic groups in one molecule and acid anhydrides thereof, and examples thereof include copolymers of (meth)acrylic acid, copolymerizations of maleic anhydride, condensates of dibasic acid, and the like. Commercially available products include Joncryl (product group name) of BASF Corporation, SMA resin (product group name) of Satoma Corporation, polyazelaic acid anhydride of Shinnihonica Corporation, and the like.

In addition, the curing catalyst is a compound capable of becoming a curing catalyst in reaction between a thermosetting resin, such as epoxy compound and oxetane compound, and a curing agent, or a polymerization catalyst when a curing agent is not used. Specific examples of the curing catalyst may include tertiary amines, tertiary amine salts, quaternary ammonium salts, tertiary phosphine, crown ether compounds, phosphonium ylides, and the like, which may be used alone or in combination of two or more thereof.

Among them, examples of the organic phosphine compound may preferably include imidazoles with the trade names of 2E4MZ, C11Z, C17Z, and 2PZ, imidazole AZINE compounds with the trade names of 2MZ-A and 2E4MZ-A, isocyanurates of imidazoles with the trade names of 2MZ-OK and 2PZ-OK, imidazolyhydroxymethyl compound with the trade names of 2PHZ and 2P4MHZ (trade names; Shikoku Kasei Industrial Co., Ltd.), dicyandiamide and derivatives thereof, melamine and derivatives thereof, diaminomaleonitrile and derivatives thereof, thiecyrentriamine, triethylenetetramine, tetraethylenepentamine, bis(hexamethylene)tolylamine, triethanolamine, diaminodiphenylmethane, etc., 1,8-giazabicyciro[5,4,0]undecene-7 (trade names: DBU, San-Apro Co., Ltd.), 3.9-bis(3-aminopropyl)-2,4,8,10-tetraoxaspiro[5,5]undecane (trade names: ATU, Ajinomoto Co., Ltd.), or organic phosphine compounds such as triphenylphosphine, tricyclohexylphosphine, tributylphosphine, and methyldiphenylphosphine.

In the solder resist composition of the present invention, the curing catalyst is preferably an amine-based, phosphine-based, or imidazole-based curing catalyst. More preferably, a melamine-based amine curing catalyst is preferred. The mixing amount of the curing catalyst is in the range of 0.1 to 10 mass %, preferably in the range of 1 to 5 mass %, and more preferably in the range of 0.1 to 3 mass %, based on the total amount of the resin composition.

When the weight ratio of the curing catalyst is within the above range, the coating film is sufficiently cured, and thus adhesion, pencil hardness, and heat resistance are excellent. However, if it is less than the above range, the coating film may uncure, and the curing time may be long. In addition, when the weight ratio of the curing catalyst exceeds the above range, the coating film may be broken due to over-curing of the solder resist, and there may be a problem with developability.

<Antioxidant>

It is preferred that the composition of the present invention also contains an antioxidant. The antioxidant may be contained so as to prevent the degradation of oxidation of curable resins, thereby inhibiting discoloration. Furthermore, heat resistance and resolution (reproducibility of line width) may be improved. That is, depending on the type of the colorant used and how it reflects and absorbs light, resolution may be deteriorated, but by containing the antioxidant good resolution can be achieved regardless of the type of the colorant used.

In particular, examples of the antioxidant having an effect as radical scavenger may include, for example, phenol-based compounds such as hydroquinone, 4-t-butylcatechol, 2-t-butylhydroquinone, hydroquinone monomethyl ether, 2,6-di-t-butyl-p-cresol, 2,2-methylene-bis(4-methyl-6-t-butylphenol), 1,1,3-tris(2-methyl-4-hydroxy-5-t-butylphenyl)butane, 1,3,5-trimethyl-2,4,6-tris(3,5-di-t-butyl-4-hydroxybenzyl)benzene, and 1,3,5-tris(3',5'-di-t-butyl-4-hydroxybenzyl)-S-triazine-2,4,6-(1H, 3H, 5H)trione, quinone-based compounds such as methoquinone and benzoquinone, amine-based compounds such as bis(2,2,6,6-tetramethyl-4-piperidyl)-sebacate, phenothiazine, and the like. As a commercially available product, for example, IRGANOX1010 (BASF Japan Co., Ltd., trade name) and the like may be used.

In addition, examples of the antioxidant having an effect as peroxide decomposer may include phosphorus compounds such as triphenylphosphite, and sulfur compounds such as pentaerythritol tetra lauryl thiopropionate, dilauryl thiopropionate, distearyl3,3'-thiodipropionate Among the above, it is preferable to use a phenolic antioxidant in that it suppresses discoloration and improves heat resistance and resolution.

Also, since an antioxidant, particularly a phenolic antioxidant, may be more effective when used in combination with a heat-resistant stabilizer, a heat-resistant stabilizer may be mixed with the resin composition of the present invention.

Examples of the heat-resistant stabilizer include phosphorus-based, hydroxylamine-based, and sulfur-based heat-resistant stabilizers. Just one type of heat-resistant stabilizer may be used alone, or 2 or more types may also be used together. Among these antioxidants, in the present invention, a hydroxylamine-based antioxidant and a sulfur-based antioxidant are preferable. More preferably, phenolic antioxidants are most preferred. When a phenolic antioxidant is used, the blending amount thereof is preferably 0.01 to 5 mass %, more preferably 0.03 to 3 mass %, based on the total composition. When the mixing amount of the antioxidant is 0.01 to 1% by mass or more, the effect of adding an antioxidant can be obtained for certain, and when the mixing amount is 1% by mass or less, a good alkalinity phenomenon can be obtained without inhibiting a photoreaction, and good dry to touch and coating properties can be ensured.

The solder resist composition of the present invention may include an organic solvent for the purpose of manufacturing a composition or adjusting viscosity when applied to a substrate or a base film. Examples of the organic solvent may include esters; aliphatic hydrocarbons such as octane and decane; petroleum-based solvents such as petroleum ether, petroleum naphtha, solvent naphtha, and the like, and commonly used organic solvents. These organic solvents can be used alone or in a combination of two or more.

In addition, the solder resist composition of the present invention may contain other additives known and commonly used in the field of electronic materials. Other additives include a thermal polymerization inhibitor, an ultraviolet absorber, a plasticizer, a flame retardant, an antistatic agent, an anti-aging agent, an antimicrobial anti-microbial agent, an antifoaming agent, a leveling agent, a thickener, an adhesion imparting agent, a thixotropic agent, a photoinitiation aid, a sensitizer, a curing accelerator, a release agent, a surface treatment agent, a dispersant, a dispersion aid, a surface modifier, a stabilizer, and the like.

Dry Film and Manufacturing Method Thereof

The dry film of the present invention has at least one solder resist layer obtained by coating and drying the solder resist composition.

When forming a dry film, the resin composition of the present invention is diluted with an organic solvent to be adjusted to an appropriate viscosity, and then applied on a base film by a comma coater, a blade coater, a lip coater, a rod coater, a squeeze coater, a reverse coater, a transfer roll coater, a gravure coater, a spray coater, or the like, to a uniform thickness, for example, in the range of 40 to 60 μm. The applied composition may then be dried, typically at a temperature in the range of 40 to 120° C. for 1 to 30 minutes, to form a solder resist layer.

There is no particular limitation on the thickness of the coating, but generally, the thickness after drying is suitably selected in the range of 10 to 150 μm, preferably 10 to 80 μm, and more preferably 10 to 60 μm.

As the base film, a plastic film may be used, and for example, a polyester film such as polyethylene terephthalate (PET), a polyimide film, a polyamideimide film, a polypropylene film, a polystyrene film, or the like may be used. Among them, polyethylene terephthalate is preferred. The thickness of the base film is not particularly limited, but is generally suitably selected in the range of 10 to 150 μm. In addition, the coating can be applied to a metal foil such as a copper foil or an aluminum foil. In addition, the carrier film used may be subjected to exfoliation treatment such as acryl, silicone and the like.

After the solder resist layer of the present invention is formed on the base film, it is preferable to further laminate a peelable protective film on the surface of the film for the purpose of preventing dust from adhering to the surface of the film. As the peelable protective film, for example, a polyethylene film, a polytetrafluoroethylene film, a polypropylene film, a surface-treated paper, or the like may be used. For the protective film, any film will do as long as its adhesion is smaller than the adhesion between the solder resist layer and the base film, when the protective film is peeled off. The thickness of the protective film is not particularly limited, but may be, for example, 10 μm to 150 μm.

In the present invention, the solder resist composition of the present invention may be applied and dried on the protective film to form a solder resist layer, and a base film may be laminated on the surface thereof. That is, when manufacturing the dry film in the present invention, any one of a protective film and a base film may be used as the film to which the solder resist composition of the present invention is applied.

In a backlight, etc., of a lighting device, a portable terminal, a personal computer, a television, or the like, the dry film of the present invention can be used to reflect light generated from a light emitting diode (LED) or electroluminescence (EL) used as a light source thereof. The dry film of the present invention may be applied to an LED, a light emitting PCB, and the like.

In order to manufacture a cured film on a printed wiring board using a dry film, a dry film protective film is peeled off, an exposed resin layer of the dry film is attached to a circuit-formed substrate using a laminator or the like, and a resin layer is formed on the circuit-formed substrate. Subsequently, a curing coating can be formed through exposure, development, and curing after heating the formed resin layer. The protective film may be peeled off either before exposure or after exposure.

The cured product of the present invention is obtained by curing the solder resist composition of the present invention or the solder resist layer of the dry film of the present invention. The cured product of the present invention may be suitably used for printed wiring boards and electronic components. The cured product of the present invention has outstanding dielectric properties including high cracking resistance, high resolution, low dielectric constant and low dielectric tangent. In addition, the cured product of the present invention has excellent heat resistance and a coefficient of linear expansion.

The printed wiring board of the present invention is composed of a cured product obtained from the solder resist composition of the present invention or the solder resist layer of a dry film. In the method of manufacturing the printed wiring board of the present invention, for example, the solder resist composition of the present invention is applied on a substrate by a method such as a dip coating method, a flow coating method, a roll coating method, a bar coating method, a screen printing method, a curtain coating method, or the like, by adjusting a viscosity suitable for a coating method using the organic solvent, and then the organic solvent included in the composition is volatilized (pre-dried) at a temperature of 60 to 100° C. to form a tacky free resin layer. In addition, in the case of the dry film, the resin layer is bonded to the substrate by a laminator or the like so as to contact the substrate, and then the carrier film is detached to form the resin layer on the substrate.

For the above substrate, not only printed wiring boards and flexible printed wiring boards formed with copper and the like, but also copper foil laminates of all grades (FR-4, etc.), using a material of copper clad laminate sheet for high frequency circuit using paper phenolic, paper epoxy, glass fiber epoxy, glass polyimide, glass fiber/epoxy, glass fiber/paper epoxy, synthetic fiber epoxy, fluoroplastic-polyethylene-polyphenylene ether, polyphenylene oxide cyanate, etc., other metal substrates, polyimide films, polyethylene terephthalate films, polyethylene naphthalate (PEN) films, glass substrates, ceramic substrates, wafer substrates, etc., can be mentioned.

The bonding on the dry film substrate is preferably carried out after being pressurized and heated using a vacuum laminator or the like. When a circuit-formed substrate is used by using such a vacuum laminator, even if the surface of the circuit board is unbalanced, bubbles are not mixed because the circuit board is in close contact with the dry film circuit board, and the concavity of the concave portion of the surface of the circuit board gets mitigated. The pressurization condition is preferably about 0.1~2.0 MPa, and the temperature condition is preferably 40~120° C.

After applying the solder resist composition of the present invention, evaporation drying can be carried out using a hot air circulation drying oven, an IR furnace, a hot plate, a convection oven, or the like (a method of contacting hot air in a drying machine using a heat source of an air heating method by steam and a spraying method on a support rather than a nozzle).

After forming the solder resist layer on the substrate, the pattern of the cured product is formed by selectively exposing the substrate to the active energy rays through a photomask with a predetermined pattern formed thereon and developing the unexposed portion with a dilute aqueous alkali solution (for example, 0.3-3 wt % sodium carbonate, Na2CO3 aqueous solution). In the case of a dry film, after exposure, a support film of the dry film is developed (peeled off) to form a cured product patterned on a substrate. In addition, as long as it does not damage the properties, the support film may be peeled off from the dry film before exposure, and the exposed paper layer may be exposed and developed.

In addition, the cured product is irradiated with an active energy ray and then subjected to heat curing (for example, 100 to 220° C.), or after the heat curing, the cured product is finally cured only by irradiation with an active energy ray or heat curing, thereby forming a cured film with excellent properties such as adhesion, hardness, and the like.

The exposure apparatus used to irradiate the active energy ray may be one equipped with a high-pressure mercury lamp, an ultra-high-pressure mercury lamp, a metal halide lamp, a mercury shot arc lamp, and the like, that may irradiate ultraviolet rays preferably in a range of 350—450 nm. In addition, a direct drawing device (e.g., a laser direct imaging device in which a computer directly draws CAD data using a laser) may also be used. As a direct drawing lamp light source or a laser light source, it is preferable that the maximum wavelength outside is in the range of 350~450 nm. The exposure for image formation varies depending on the thickness, etc., but may generally be within a range of 10~1000 mJ/cm2, preferably 20~800 mJ/cm2.

The developing method may be a dipping method, a shower method, a spray method, a brush method, or the like, and an alkaline aqueous solution such as potassium hydroxide, sodium hydroxide, sodium carbonate, potassium carbonate, sodium phosphate, sodium silicate, ammonia, amines, or the like may be used as the developing solution.

Solder Resist Layer and Manufacturing Method Thereof

The cured product of the present invention may be formed by curing the solder resist composition of the present invention or the solder resist layer of the dry film of the present invention.

The solder resist composition of the present invention can be heat-cured, for example, at a temperature of about 100 to 180° C., thereby forming a cured film (cured product) having high reflectance and excellent yellowing resistance and crack resistance.

Printed Wiring Board and Method of Manufacturing the Same

The printed wiring board of the present invention may have a cured product of the solder resist composition of the present invention or a cured film formed by curing the solder resist layer of the dry film of the present invention.

The printed wiring board of the present invention may include a dry film including one or more layers formed from the solder resist composition.

When forming the printed wiring board, a dry film is placed on a test board, and the dry film is transferred onto the test board by vacuum lamination.

Thereafter, the base film is peeled off, and the substrate to which the dry film from which the base film has been peeled off has been transferred is subjected to UV exposure using an exposure apparatus. In the case of exposure in this way, the exposed portion (irradiated portion) is cured. After exposure, the substrate is cooled at room temperature, and then the unexposed portion is developed with an aqueous alkali solution by putting it in a developer to complete the formation of a resist pattern. The substrate on which the pattern is formed through development is post-cured in an oven at 150° C. for 1 hour to complete substrate manufacturing.

In the method of manufacturing the printed wiring board including the solder resist layer according to the present invention, the base film may be peeled off before performing the exposure operation after the lamination process. In the case of a colored solder resist layer, exposure is performed on the base film with the base film attached. As described above, when it is exposed with the base film attached, the light is refracted while passing through the base film, the surface portion of the pattern is exposed by the refraction of the light, and the reaction occurs by the high-sensitivity photopolymerization initiator. However, since the solder resist layer has high reflectance, light is reflected from the surface of the solder resist layer, and thus an additional light reaction occurs on the surface (upper portion) of the solder resist layer due to the reflected light, and a halation occurs on the upper portion of the coating film. On the contrary, the lower portion has relatively less light energy transmitted and thus a phenomenon (undercut) where the lateral portion becomes narrow occurs.

Specifically, in the white solder resist layer, a halation occurs in an upper portion of the coating film, and an undercut occurs in a lower portion of the coating film, but this phenomenon does not occur in the blue solder resist layer.

As described above, when the exposure is performed in a state in which the base film is attached to the white solder resist layer, halation gets severe at the upper portion of the coating film. In addition, as the halation continues, it becomes harder to realize a pattern and also reduces resolution.

FIG. 1 is a comparison between a printed wiring board exposed to UV with a base film peeled off and a printed wiring board exposed to UV with a base film attached. When it was exposed without the base being peeled off before the UV exposure, light was reflected from the surface of the white solder resist layer, and thus halation occurred at an upper portion.

However, when the exposure was performed with the base film peeled off as in the present invention, the photopolymerization initiator reacts with oxygen, and since the reaction of the photopolymerization initiator on the surface is inhibited, the phenomenon of halation is reduced and the solder resist pattern is well implemented even in the white solder resist layer.

Specifically, when the base film is not present, oxygen interferes with radical formation of the photopolymerization initiator to prevent a chain reaction, thereby reducing the halation at the upper portion. On the other hand, when the base film is present, the base film interferes with the contact between oxygen and the photopolymerization initiator, and thus the radical chain reaction continues, and as a result, halation becomes severe at an upper portion.

MODES TO CARRY OUT THE INVENTION

Examples

Hereinafter, the present invention will be described in detail with reference to Examples. The present invention is not limited to the following examples.

Synthesis Example 1 (Alkali-Soluble Resin A, Copolymer Resin)

A mixture of 174.0 parts by weight of methacrylic acid, 174.0 parts by weight of ε-caprolactone modified methacrylic acid (average molecular weight: 314), 77.0 parts by weight of methyl methacrylic acid, 222.0 parts by weight of dipropylene glycol monomethyl ether, and 12.0 parts by weight of t-butylperoxy-2-ethylhexanoate (Perbutyl-O of Nichiyu) as a polymerization catalyst was added dropwise over 3 hours by heating 325.0 parts by weight of dipropylene glycol monomethyl ether as a solvent to 110° C. in a flask equipped with a thermometer, a stirrer, a dropping funnel, and a reflux condenser, and the mixture was stirred at 110° C. for 3 hours, and the polymerization catalyst was deactivated to obtain a resin solution. After cooling the resin solution, 289.0 parts by weight of M100 of Daicel's cyclomer, 3.0 parts by weight of triphenylphosphine, and 1.3 parts by weight of hydroquinone monomethyl ether were added thereto, the temperature was raised to 100° C., and the mixture was stirred to perform a ring-opening addition reaction of an epoxy ring to obtain a resin solution A. The solid content of the obtained resin solution A was 55 wt %, and the acid value of the solid content was 79.8 mgKOH/g.

Synthesis Example 2, D Resin Solution

It was confirmed that 200 parts by weight of deionized water and 0.3 parts by weight of sodium sulfate were injected into an internal pressure vessel equipped with a thermometer, a cooling tube, and a stirrer and dissolved. Then, 5 parts by weight of BPO (benzoyl peroxide) as a polymerization initiator and 5 parts by weight of MSD (α-methylstyrendimer) as a chain transfer agent were added to a monomer mixture including 10.4 parts by weight of MMA (methylmethacrylate)), 5 parts by weight of n-BA (n-butylacrylate), 24.6 parts by weight of MAA (methacrylic acid), and 60 parts by weight of styrene, and sufficiently dissolved. After that, the dispersant was added to a concentration of 300 ppm and sufficiently stirred. The inside of the kiln is replaced with nitrogen, and then the temperature was raised to perform suspension polymerization. After the polymerization was completed, the obtained suspension solution was filtered on a 30 μm mesh and dried with hot air at 40° C. to obtain a resin in a particulate state. A resin solution D was prepared by sufficiently dissolving the obtained granular resin (copolymerized resin) to have a solid concentration of 50 wt % using an organic solvent DPM (dipropylene glycol methyl ether).

Synthesis Example 3, F Resin Solution 433 g of a 53 wt % solution of epoxy acrylate including a urethane bond or a bisphenol AD skeleton was added with 0.5 g of triphenol phosphine and 183 g (1.2 mol) of tetrahydromaleic acid and reacted at 110° C. for 5 hours while stirring. Consequently, an epoxy acrylate resin solution F containing a carboxyl group and having a urethane bond and a bisphenol skeleton was obtained. The solid content of the obtained resin solution F was 51 wt %, the solid acid value was 85 mg KOH/g, and the Tg obtained from DSC measurement was 19.2° C.

(Sulfur Concentration Analysis Method)

Sulfur concentration was measured by the following method. 0.25 g of each component was measured, and this was used as a measurement sample. As a pre-treatment, a sample combustion apparatus manufactured by Mitsubisi Kagaku Co., Ltd.: A QF-02 type was used to perform a combustion treatment on each measurement sample by a quartz tube combustion method according to the following conditions.

1. Combustion Condition
   - (1) Conditions for raising temperature (heating part) Room temperature→(5° C./min.)→200° C.→(10° C./min.)→500° C.→*(5° C./min.)→900° C. 5 min. Keep
   - (2) Combustion condition (combustion part) Inlet (inlet): 850° C., outlet (outlet): 900° C.
   - (3) Combustion Time 40 min. (Total)
2. Gas Conditions (all Indicated Values by the Flow Meter of the Device Body)
   - (1) Oxygen SUB 100 ml/min.
   - (2) Oxygen MAIN 200 ml/min.
   - (3) Argon/Oxygen 100 ml/min. (Switch from 700° C.)
   - (4) Total Flow Rate 400 ml/min.
3. Combustion Gas Condition
   - (1) Temperature rising part up to 700° C.: Argon, 700° C. Up: Oxygen
   - (2) Combustion part 900° C.: Oxygen
4. Absorption Solution 0.3% Hydrogen Peroxide Solution 15 ml (after Combustion Treatment, Mess-Up with 25 ml)

The obtained absorbent solution after the mess-up was subjected to ion chromatography according to the following conditions, and the ion content was measured to obtain a sulfur concentration of each component.

Ion Chromatograph: ICS-1500 (Thermo Fisher Scientific)

Eluent: 2.7 mM Na2CO3/0.3 mM NaHCO3

Column: Ion Pac AS12A (Thermo Fisher Scientific)

Flow rate: 1 ml/min.

Suppressor: ASRS300

Injection: 25 μl

Preparation of Solder Resist Resin Composition

TABLE 1-1

Content of each component of the solder resist composition (unit: based on mass % of the entire composition, (C) content of mercapto modified acrylate is pure monomer (solid content))

| Ingredients | Example 1 | Example 2 | Example 3 | Example 4 | Example 5 | Example 6 | Comparison 1 | Comparison 2 | Comparison 3 |
|---|---|---|---|---|---|---|---|---|---|
| (A) | 13.00 | 13.00 | 13.00 | 13.00 | 13.00 | 13.00 | 13.00 | 0.00 | 13.00 |
| (B) Titanium oxide | 48.83 | 48.83 | 48.34 | 48.06 | 47.87 | 43.26 | 48.91 | 57.74 | 50.79 |
| (B) Silica | 1 | 1 | 1 | 1 | 1 | 1 | 1 | 1 | 1 |
| (C) | 2.00 | 2.00 | 2.00 | 2.00 | 2.00 | 7.62 | 0.00 | 2.00 | 2.00 |
| (D) | 3.00 | 3.00 | 3.00 | 3.00 | 3.00 | 3.00 | 4.92 | 5.81 | 0.00 |
| (E) | 0.00 | 0.00 | 0.49 | 0.78 | 0.97 | 0.00 | 0.00 | 1.16 | 1.02 |
| (F) | 10.00 | 10.00 | 10.00 | 10.00 | 10.00 | 10.00 | 10.00 | 10.00 | 10.00 |
| Photopolymerization initiator phosphine-based | 2.00 | 2.00 | 2.00 | 2.00 | 2.00 | 2.00 | 2.00 | 2.00 | 2.00 |
| Photopolymerization initiator | 0.50 | 0.00 | 0.00 | 0.00 | 0.00 | 0.00 | 0.00 | 0.00 | 0.00 |
| Photopolymerization initiators Oxime-based initiation | 0.00 | 0.50 | 0.50 | 0.50 | 0.50 | 0.50 | 0.50 | 0.50 | 0.50 |
| Epoxy resin | 9.00 | 9.00 | 9.00 | 9.00 | 9.00 | 9.00 | 9.00 | 9.00 | 9.00 |
| Acryl resin | 9.00 | 9.00 | 9.00 | 9.00 | 9.00 | 9.00 | 9.00 | 9.00 | 9.00 |
| Heat curing catalyst | 1.00 | 1.00 | 1.00 | 1.00 | 1.00 | 1.00 | 1.00 | 1.00 | 1.00 |
| Dispersant | 0.53 | 0.53 | 0.52 | 0.52 | 0.52 | 0.49 | 0.53 | 0.62 | 0.55 |
| Antioxidant | 0.14 | 0.14 | 0.14 | 0.14 | 0.14 | 0.13 | 0.14 | 0.17 | 0.15 |
| Total | 100.00 | 100.00 | 100.00 | 100.00 | 100.00 | 100.00 | 100.00 | 100.00 | 100.00 |

(A) A resin solution synthesized above (carboxylic acid equivalent of solid content: 881.7, solid content: 55%)
(B) Rutile Titanium Oxide, R-931 by DuPont
(B) Silica Admapine SO-E2 by Admatechs
(C) Mercapto Modified Acrylate, MT-NR1 by Showa Denko Co., Ltd.
(D) The D resin solution synthesized above (carboxylic acid equivalent of solid: 239.8, solid: 50%)
(E) Silane Coupling Agent, KBE-403, by SHIN-ETSU CHEMICAL CO., LTD.
(F) Preparation of Ebecryl 210 Resin with Urethane Bond, Daicel Allnex Co., Ltd.
Photopolymerization initiator phosphine-based compound: 2,4,6-trimethylbenzoyldiphenylphosphine oxide Omnirad TPO by IGM Resins
Photopolymerization initiator: titanocene initiator, IRGACURE 784 by BASF Japan
Photopolymerization Initiator Oxime-Based: Oxime Ester Initiator IRGACURE OXE02 by BASF Japan
Epoxy resin: jER828 (bisphenol A type epoxy resin by Mitsubishi Chemical, solid epoxy equivalent: 190, solid 100%)
Acrylic resin: KAYARAD DPCA-60 by Nippon Chemical Co., Ltd.
Heat curing catalyst: melamine, dicyandiamide by Mitsubishi Chemical Co. Ltd.
Dispersant: DisperbyK-110 by BYK
Antioxidant: Preparation of phenolic antioxidant IRGANOX1010 by BASF Japan

TABLE 1-2

Content of each component of the solder resist composition (unit: based on mass % of the entire composition, (C) content of mercapto modified acrylate is pure monomer (solid content))

| Ingredients | Example 7 | Example 8 | Example 9 | Comparison 4 | Comparison 5 | Comparison 6 | Comparison 7 | Comparison 8 | Comparison 9 |
|---|---|---|---|---|---|---|---|---|---|
| (A) | 13 | 13 | 13 | 13 | 13 | 13 | 13 | 13 | 13 |
| (B) Titanium oxide | 52.34 | 51.34 | 48.34 | 56.34 | 46.34 | 44.34 | 54.34 | 51.34 | 48.34 |
| (B) Silica | 1 | 1 | 1 | 1 | 1 | 1 | 1 | 1 | 1 |
| (C) | 2 | 2 | 2 | 0 | 0 | 0 | 0 | 0 | 0 |
| (D) | 3 | 3 | 3 | 3 | 3 | 3 | 3 | 3 | 3 |
| (E) | 0.49 | 0.49 | 0.49 | 0.49 | 0.49 | 0.49 | 0.49 | 0.49 | 0.49 |

TABLE 1-2-continued

Content of each component of the solder resist composition (unit: based on mass % of the entire composition, (C) content of mercapto modified acrylate is pure monomer (solid content))

| Ingredients | Example 7 | Example 8 | Example 9 | Comparison 4 | Comparison 5 | Comparison 6 | Comparison 7 | Comparison 8 | Comparison 9 |
|---|---|---|---|---|---|---|---|---|---|
| (F) | 10 | 10 | 10 | 10 | 10 | 10 | 10 | 10 | 10 |
| Photopolymerization initiator phosphine-based | 2 | 2 | 2 | 2 | 2 | 2 | 2 | 2 | 2 |
| Photopolymerization initiators Oxime-based initiation | 0.5 | 0.5 | 0.5 | 0.5 | 0.5 | 0.5 | 0.5 | 0.5 | 0.5 |
| Epoxy resin | 5 | 6 | 9 | 3 | 11 | 13 | 5 | 6 | 9 |
| Acryl resin | 9 | 9 | 9 | 9 | 11 | 11 | 9 | 11 | 11 |
| Heat curing catalyst | 1 | 1 | 1 | 1 | 1 | 1 | 1 | 1 | 1 |
| Dispersant | 0.53 | 0.53 | 0.53 | 0.53 | 0.53 | 0.53 | 0.53 | 0.53 | 0.53 |
| Antioxidant | 0.14 | 0.14 | 0.14 | 0.14 | 0.14 | 0.14 | 0.14 | 0.14 | 0.14 |
| Total | 100.00 | 100.00 | 100.00 | 100.00 | 100.00 | 100.00 | 100.00 | 100.00 | 100.00 |
| Epoxy group/carboxyl group equivalent ratio | 0.59 | 0.70 | 1.05 | 0.35 | 1.29 | 1.52 | 0.59 | 0.70 | 1.05 |

(A) A resin solution synthesized above (carboxylic acid equivalent of solid content: 881.7, solid content: 55%)

(B) Rutile Titanium Oxide, R-931 by DuPont (B) Silica Admapine SO-E2 by Admatechs (C) Mercapto-Modified Acrylate ES110N by Miwon Specialty Chemical Co., Ltd.

(D) The D resin solution synthesized above (carboxylic acid equivalent of solid: 239.8, solid: 50%)

(E) Silane Coupling Agent, KBE-403, by SHIN-ETSU CHEMICAL CO., LTD.

(F) The F resin solution synthesized above (carboxylic acid equivalent of solid content 166.7, solid content 51%)

Photopolymerization initiator phosphine-based compound: 2,4,6-trimethylbenzoyldiphenylphosphine oxide Omnirad TPO by IGM Resins Photopolymerization initiator: titanocene initiator, IRGACURE 784 by BASF Japan Photopolymerization Initiator Oxime-Based: Oxime Ester Initiator IRGACURE OXE02 by BASF Japan Epoxy resin: jER828 (bisphenol A type epoxy resin by Mitsubishi Chemical, solid epoxy equivalent: 190, solid 100%)

Acrylic resin: KAYARAD DPCA-60 by Nippon Chemical Co., Ltd.

Heat curing catalyst: melamine, dicyandiamide by Mitsubishi Chemical Co. Ltd.

Dispersant: DisperbyK-110 by BYK

Antioxidant: Preparation of phenolic antioxidant IRGANOX1010 by BASF Japan

TABLE 1-3

Content of each component of the solder resist composition (unit: based on mass % of the entire composition, (C) content of mercapto modified acrylate is pure monomer (solid content))

| Ingredients | Example 10 | Example 11 | Example 12 |
|---|---|---|---|
| (A) | 13 | 13 | 13 |
| (B) Titanium oxide | 48.34 | 24.67 | 5 |
| (B) Silica | 1 | 24.67 | 22.18 |
| (B) Barium sulfate ($BaSO_4$) | 0 | 0 | 22.17 |
| (C) | 2 | 2 | 2 |
| (D) | 3 | 3 | 3 |
| (E) | 0.49 | 0.49 | 0.49 |
| (F) | 10 | 10 | 10 |
| Photopolymerization initiator phosphine-based | 2 | 2 | 2 |
| Photopolymerization initiator | 0.5 | 0.5 | 0.5 |
| Epoxy resin | 9 | 9 | 9 |
| Acryl resin | 9 | 9 | 9 |
| Heat curing catalyst | 1 | 1 | 1 |
| Dispersant | 0.53 | 0.53 | 0.52 |
| Antioxidant | 0.14 | 0.14 | 0.14 |
| Total | 100.00 | 100.00 | 100.00 |

(A) A resin solution synthesized above (carboxylic acid equivalent of solid content: 881.7, solid content: 55%)
(B) Rutile Titanium Oxide, R-931 by DuPont
(B) Silica Admapine SO-E2 by Admatechs
(B) Barium sulfate $BaSO_4$ by Sakai Kagaku Co., Ltd.
(C) Mercapto-Modified Acrylate ES110N by Miwon Specialty Chemical Co., Ltd.
(D) The D resin solution synthesized above (carboxylic acid equivalent of solid: 239.8, solid: 50%)
(E) Silane Coupling Agent, KBE-403, by SHIN-ETSU CHEMICAL CO., LTD.
(F) The F resin solution synthesized above (carboxylic acid equivalent of solid content 166.7, solid content 51%)
Photopolymerization initiator phosphine-based compound: 2,4,6-trimethylbenzoyldiphenylphosphine oxide Omnirad TPO by IGM Resins
Photopolymerization initiator: titanocene initiator, IRGACURE 784 by BASF Japan
Photopolymerization Initiator Oxime-Based: Oxime Ester Initiator IRGACURE OXE02 by BASF Japan
Epoxy resin: jER828 (bisphenol A type epoxy resin by Mitsubishi Chemical, solid epoxy equivalent: 190, solid 100%)
Acrylic resin: KAYARAD DPCA-60 by Nippon Chemical Co., Ltd.
Heat curing catalyst: melamine, dicyandiamide by Mitsubishi Chemical Co. Ltd.
Dispersant: DisperbyK-110 by BYK
Antioxidant: Preparation of phenolic antioxidant IRGANOX1010 by BASF Japan Manufacture of Dry Film Including Solder Resist Layer The resin compositions of each Example and Comparative Example were coated to a uniform thickness (40 to 60 μm) on a base film (PET film) (XD-500P manufactured by Toray, film thickness: 25 μm) by using a comma coater in a vacuum. (2) The applied resin composition was dried in four temperature chambers (Chamber 1: 60° C., Chamber 2: 80° C. Chamber 3: 100° C. Chamber 4: 100° C.) in the range of 40~120° C. (3) A properly dried coating film on a base film was laminated with a protective film (PP film) to prepare a dry film. In this case, the thickness of the dried coating film was in the range of 40 μm to 60 μm.

Evaluation of Dry Film

<Sensitivity>

The dry films manufactured in each Example and Comparison were laminated on a substrate (lamination conditions—measurement equipment: vacuum laminator (CVP-300, Nikko Materials Co., Ltd.); 1 chamber: temperature 60° C., vacuum time 10 sec, vacuum degree 3 hPa., pressure 0.2 MPa., pressure time 10 sec; 2 chamber: temperature 70° C., pressure 6 kgf/cm$^2$, pressure time 20 sec), and then the PET film was allowed to stand at room temperature, and then the PET film was peeled off. Using a Kodak step tablet N0.2 (41 steps) as a photomask, with a DI exposure apparatus manufactured by Screen, it was exposed to 300 mJ/cm$^2$ as measured by an integrating photometer, and a 1% $Na_2CO_3$ aqueous solution of 30° C. was developed under a spray pressure of 0.2 MPa for 60 seconds, and the gloss level of the cured coating was checked visually.

<Developability>

The dry films prepared in each Example and Comparison were laminated on the substrate, dried at 90° C. for 0 to 20 minutes, and then cooled to room temperature, and then a 1% $Na_2CO_3$ aqueous solution of 30° C. was developed under a spray pressure of 0.2 MPa for 60 seconds to check whether there is any residue on the substrate.

PASS: O No residue on the measuring substrate.

NG: X There are residues on the measurement board.

<Adhesion>

The dry films produced in each Example and Comparison are laminated on the substrate, and the PET film is peeled off. With a DI exposure apparatus manufactured by Screen, using a Kodak step tablet N0.2 (41 steps) as a photomask, it was exposed to 300 mJ/cm2 as measured by an integrating photometer to be in 23 steps, and a 1% $Na_2CO_3$ aqueous solution of 30° C. was developed under a spray pressure of 0.2 MPa for 60 seconds, and finally cured in an oven at 150° C. to prepare a substrate. A 10×10 grid of 1 mm squares are patterned on the manufactured substrate, and a transparent adhesive tape is completely attached to them, and then, while maintaining one end of the tape at a right angle to the substrate, the tape is removed at an instant, and then the number of squares remaining without being completely peeled off was observed. The results were recorded using the number of remaining squares as the numerator and the total number of squares (100) as the denominator.

○: 100% of the squares remains.

Δ: 95 to 99% of the squares remains.

X: Less than 95% of the squares remains.

<Solder Heat Resistance>

The substrate manufactured by the same method as described above was immersed in a soldering bath of 260° C. for 10 seconds, and then a peeling test was performed in the same manner as in the adhesion evaluation to evaluate the coating state under the following criteria.

○: 100% of the squares remains.

Δ: 95 to 99% of the squares remains.

X: Less than 95% of the squares remains.

<Pencil Hardness>

Using the substrate prepared in the same manner as above, pencils from B to 9H, which had been polished so that the end of the core was flattened, were pressed at an angle of about 45° to record the hardness of the pencils without peeling of the coating film.

<Solvent Resistant>

Using the substrate manufactured by the same method, the coating film was immersed in a mixed solution of isopropyl alcohol and distilled water (75%: 25%) for 15 minutes, and then the coating film state was evaluated under the following criteria.

Pass: No swelling, discoloration or peeling on solder resist.

NG: Swelling, discoloration, and peeling on solder resist observed.

<HAST Resistance>

Dry films prepared in Examples and Comparisons were laminated on a substrate on which a comb-shaped electrode (line/space=50 μm/50 μm) was formed, exposed to 300 mJ/cm2 with an integrated photometer, developed in a 1% $Na_2CO_3$ aqueous solution of 30° C. for 60 seconds under the condition of a spray pressure of 0.2 MPa, and a dry film cured in an oven at 150° C. for 60 minutes was formed as a coating film to prepare a HAST evaluation substrate. The evaluation substrate was placed in a high-temperature and high-humidity bath in an atmosphere of a temperature of 110° C. and a humidity of 85%, charged with a voltage of 20V, and subjected to a Highly Accelerated Stress Test (HAST) in the bath for 250 hours. After 250 hours, discoloration and elution of cured coating of the dry films were evaluated according to the following judgment criteria. (Equipment Manufacturer: Espec, Ion migration system, Equipment Name: NY IM1064).

○: No peeling, discoloration or elution observed.

Δ: Peeling, discoloration, or elution observed

X: Peeling, discoloration, or elution are frequently observed with the naked eye <Reflectance after HAST Test>

After performing the in-bath HAST test on the HAST evaluation substrate, the reflectance was measured (Equipment Manufacturer: Espec, Ion migration system, Equipment Name: NY IM1064) and the initial reflectance was 91%.

○: Reflectance exceeds 85%

Δ: Reflectance of equal to or more than 80% and less than 85%

X: Reflectance less than 80%

TABLE 2-1

| Reliability evaluation result | | | | | | | | | |
|---|---|---|---|---|---|---|---|---|---|
| evaluation categories | Example 1 | Example 2 | Example 3 | Example 4 | Example 5 | Example 6 | Comparison 1 | Comparison 2 | Comparison 3 |
| sensitivity | 23 | 23 | 23 | 23 | 23 | 23 | 20 | 21 | 19 |
| developability (90° C. × 5 mins) | ○ | ○ | ○ | ○ | ○ | ○ | ○ | X | ○ |
| developability (90° C. × 10 mins) | ○ | ○ | ○ | ○ | ○ | ○ | ○ | X | ○ |
| developability (90° C. × 15 mins) | ○ | ○ | ○ | ○ | ○ | ○ | ○ | X | ○ |
| developability (90° C. × 20 mins) | ○ | ○ | ○ | ○ | ○ | ○ | ○ | X | ○ |
| adhesion | ○ | ○ | ○ | ○ | ○ | ○ | ○ | X | ○ |
| solder heat resistance | ○ | ○ | ○ | ○ | ○ | ○ | X | X | ○ |
| pencil hardness | 8H | 8H | 8H | 8H | 8H | 8H | 5H | 4H | 5H |
| solvent resistance | Pass | Pass | Pass | Pass | Pass | Pass | NG | NG | NG |

In Examples 1 to 6, sensitivity, developability, adhesion, and solder heat resistance were excellent, the film coating was rigid, and solvent resistance was also excellent. On the other hand, in the case of Comparisons 1 to 3, sensitivity and solder heat resistance were low, and they was softer than Examples 1 to 6, and as a result of the solvent resistance test, swelling, discoloration, and peeling on the solder resist were observed.

TABLE 2-2

| Reliability evaluation result | | | | | | | | | |
|---|---|---|---|---|---|---|---|---|---|
| Evaluation categories | Example 7 | Example 8 | Example 9 | Comparison 4 | Comparison 5 | Comparison 6 | Comparison 7 | Comparison 8 | Comparison 9 |
| HAST resistance | ○ | ○ | ○ | X | ○ | ○ | X | X | X |
| reflectance after HAST test | ○ | ○ | ○ | X | ○ | ○ | X | X | X |
| developability ((90° C. × 20 mins) | ○ | ○ | ○ | ○ | X | X | ○ | ○ | ○ |
| adhesion | ○ | ○ | ○ | ○ | ○ | ○ | ○ | ○ | ○ |
| solder heat resistance | ○ | ○ | ○ | X | ○ | ○ | X | X | X |
| solvent resistance | Pass | Pass | Pass | NG | Pass | Pass | Pass | Pass | Pass |

In Examples 7 to 9, HAST resistance was excellent; reflectance was not significantly decreased after the HAST test; there was no problem in developability; and adhesion, solder heat resistance, and solvent resistance were also excellent.

On the other hand, in the case of Comparison 4, because the adhesion of the cured coating film was reduced after the HAST test, HAST resistance was not good, and also the reflectance after the HAST test was greatly reduced, and solvent resistance and solder heat resistance were also poor. In addition, Comparisons 5 and 6 had poor developability. In the case of Comparisons 7 to 9, HAST resistance was not good, and the reflectance after the HAST test was greatly reduced, and solder heat resistance was also not good.

<Reflectance>

The dry films produced in each Example and Comparisons are laminated on the substrate, and the PET film is peeled off. With a DI exposure apparatus manufactured by Screen, using a Kodak step tablet N0.2 (41 steps) as a photomask, it was exposed to 300 mJ/$cm^2$ as measured by an integrating photometer to be in 23 steps, and a 1% $Na_2CO_3$ aqueous solution of 30° C. was developed under a spray pressure of 0.2 MPa for 60 seconds, and was cured in an oven of 150° C. for 60 minutes to obtain a substrate. The reflectance at a wavelength of 450 nm was measured on the coating surface of the obtained substrate using a spectrophotometer (CM-2600d, Konica Minolta Sensing Co., Ltd.) (Table 3). Reflow was performed once to three times at 260° C., and reflectance was measured (Table 4). In addition, after the final curing, UV was passed through an integrating photometer at 500 mJ/cm2 for 1 to 3 times, and reflectance was measured (Table 5).

TABLE 3

Evaluation of Reflectance after Final Curing

| | Example 1 | Example 2 | Example 3 | Example 4 | Example 5 | Example 6 |
|---|---|---|---|---|---|---|
| L | 96.95 | 97.25 | 97.16 | 97.25 | 97.15 | 97.26 |
| a | −1.57 | −1.55 | −1.42 | −1.55 | −1.58 | −1.44 |
| b | 2.43 | 2.06 | 1.8 | 2.06 | 2.03 | 1.76 |
| 450 nm reflectance | 92.3 | 91.9 | 91.8 | 92.1 | 92.2 | 92.5 |
| | **Example 7** | **Example 8** | **Example 9** | **Example 10** | **Example 11** | **Example 12** |
| L | 97.18 | 97.20 | 96.26 | 97.16 | 90.75 | 84.35 |
| a | −1.56 | −1.94 | −1.84 | −1.96 | 1.74 | 2.63 |
| b | 2.04 | 1.96 | 2.16 | 3.19 | 1.78 | −4.16 |
| 450 nm reflectance | 91.9 | 92.0 | 91.8 | 92.1 | 83.2 | 62.8 |

For the measurement results of Examples 1 to 12, the L value of the spectrophotometer was 80 or more, the a value −5 or more, and the b value −5 or more.

TABLE 4

Reflectance Evaluation after Reflow

| | Number of reflows | Lab L | Lab a | Lab b | Average reflctance (%) | Reflectance by wavelength (%) 450 nm | Reflectance reduction ratio |
|---|---|---|---|---|---|---|---|
| Example 1 | 0 | 97.13 | −1.55 | 1.99 | 92.76 | 92.00 | — |
| | 1 | 97.07 | −1.67 | 2.47 | 92.61 | 91.22 | −0.84% |
| | 2 | 96.92 | −1.72 | 2.67 | 92.24 | 90.57 | −1.55% |
| | 3 | 96.86 | −1.79 | 2.97 | 92.10 | 90.06 | −2.10% |
| Example 2 | 0 | 97.22 | −1.56 | 1.93 | 92.98 | 92.30 | — |
| | 1 | 97.16 | −1.71 | 2.46 | 92.82 | 91.56 | −0.80% |
| | 2 | 97.04 | −1.76 | 2.63 | 92.54 | 90.98 | −1.43% |
| | 3 | 96.94 | −1.81 | 2.86 | 92.30 | 90.39 | −2.06% |
| Example 3 | 0 | 97.08 | −1.58 | 1.91 | 92.64 | 91.95 | — |
| | 1 | 97.09 | −1.80 | 2.66 | 92.65 | 91.27 | −0.74% |
| | 2 | 96.95 | −1.83 | 2.76 | 92.32 | 90.67 | −1.39% |
| | 3 | 96.86 | −1.88 | 3.03 | 92.11 | 90.04 | −2.07% |
| Example 4 | 0 | 97.17 | −1.58 | 1.95 | 92.86 | 92.13 | — |
| | 1 | 97.12 | −1.89 | 2.85 | 92.72 | 91.37 | −0.82% |
| | 2 | 96.99 | −1.90 | 2.97 | 92.41 | 90.69 | −1.58% |
| | 3 | 97.00 | −1.97 | 3.19 | 92.44 | 90.49 | −1.81% |
| Example 5 | 0 | 97.16 | −1.62 | 1.95 | 92.83 | 92.09 | — |
| | 1 | 97.10 | −1.75 | 2.38 | 92.68 | 91.46 | −0.68% |
| | 2 | 96.98 | −1.78 | 2.63 | 92.40 | 90.78 | −1.43% |
| | 3 | 96.91 | −1.85 | 2.87 | 92.22 | 90.28 | −1.99% |
| Example 6 | 0 | 96.28 | −1.82 | 2.25 | 92.21 | 91.30 | — |
| | 1 | 95.13 | −1.83 | 2.71 | 90.11 | 89.29 | −2.20% |
| | 2 | 95.30 | −1.92 | 3.20 | 89.12 | 88.12 | −3.56% |
| | 3 | 95.44 | −1.93 | 3.42 | 88.33 | 88.00 | −3.61% |
| Comparison 1 | 0 | 96.18 | −1.74 | 2.20 | 92.0 | 91.20 | — |
| | 1 | 95.23 | −1.79 | 2.60 | 90.31 | 89.39 | −1.98% |
| | 2 | 95.30 | −1.82 | 3.10 | 89.51 | 88.35 | −3.19% |
| | 3 | 95.54 | −1.85 | 3.30 | 87.32 | 86.03 | −5.85% |

TABLE 4-continued

| Reflectance Evaluation after Reflow | | | | | | | |
|---|---|---|---|---|---|---|---|
| | | | | | | Reflectance by wavelength (%) | |
| | | Lab | | | Average | | Reflectance |
| | Number of reflows | L | a | b | reflctance (%) | 450 nm | reduction ratio |
| Comparison 2 | 0 | 94.12 | −1.61 | 3.90 | 85.90 | 84.16 | — |
| | 1 | 93.98 | −1.62 | 4.10 | 85.10 | 82.21 | −1.95% |
| | 2 | 93.85 | −1.58 | 4.32 | 84.65 | 81.10 | −3.06% |
| | 3 | 93.72 | −1.55 | 4.41 | 84.02 | 79.96 | −4.20% |
| Comparison 3 | 0 | 95.21 | −1.68 | 3.31 | 88.12 | 86.17 | — |
| | 1 | 94.99 | −1.65 | 3.52 | 87.99 | 84.23 | −1.94% |
| | 2 | 94.55 | −1.57 | 3.61 | 87.53 | 83.21 | −2.96% |
| | 3 | 94.05 | −1.52 | 4.07 | 87.05 | 80.31 | −5.80% |

In Examples 1 to 6, the average reflectance (reflow was conducted 0, 1, 2, 3 times) and the reflectance at 450 nm were higher than those of Comparisons 1 to 3. In particular, in Examples 1 to 6, the reflectance at 450 nm was reduced to a range of 1.81% to 3.61% even after the reflow was performed three times, and thus it could be confirmed that reflectance was less reduced even after the reflow. On the other hand, in the case of Comparisons 1 to 3, the reflectance was reduced by 5.85%, 4.20%, and 5.8%, respectively, and thus it was confirmed that the reflectance was significantly reduced after reflow compared to Examples 1 to 6.

Meanwhile, in Examples 1 to 6, b values before and after reflow were smaller than those of Comparisons 1 to 3. This indicates that yellowing of Examples 1 to 6 is less than that of the Comparisons 1 to 3.

TABLE 5

| Evaluation of Reflectance after UV Treatment after Final Curing | | | | | | | |
|---|---|---|---|---|---|---|---|
| | | | | | | Reflectance by wavelength (%) | |
| | | Lab | | | Average | | Reflectance |
| | UV counts | | 450 nm | | reflctance (%) | 450 nm | reduction ratio |
| Example 1 | 0 | 97.18 | −1.53 | 1.91 | 92.88 | 92.20 | — |
| | 1 | 96.79 | −1.33 | 2.10 | 91.92 | 91.18 | −1.11% |
| | 2 | 96.61 | −1.28 | 2.31 | 91.49 | 90.58 | −1.78% |
| | 3 | 96.53 | −1.29 | 2.39 | 91.28 | 90.31 | −2.09% |
| Example 2 | 0 | 97.20 | −1.54 | 1.94 | 92.94 | 92.20 | — |
| | 1 | 96.82 | −1.37 | 2.14 | 92.01 | 91.26 | −1.02% |
| | 2 | 96.65 | −1.33 | 2.35 | 91.58 | 90.67 | −1.68% |
| | 3 | 96.55 | −1.35 | 2.46 | 91.34 | 90.34 | −2.05% |
| Example 3 | 0 | 97.18 | −1.57 | 1.97 | 92.89 | 92.11 | — |
| | 1 | 96.77 | −1.37 | 2.16 | 91.87 | 91.08 | −1.12% |
| | 2 | 96.60 | −1.33 | 2.33 | 91.46 | 90.55 | −1.71% |
| | 3 | 96.47 | −1.32 | 2.43 | 91.14 | 90.11 | −2.21% |
| Example 4 | 0 | 96.99 | −1.56 | 2.04 | 92.42 | 91.52 | — |
| | 1 | 96.63 | −1.38 | 2.20 | 91.54 | 90.66 | −0.94% |
| | 2 | 96.60 | −1.30 | 2.22 | 91.46 | 90.56 | −1.06% |
| | 3 | 96.39 | −1.29 | 2.35 | 90.96 | 89.91 | −1.78% |
| Example 5 | 0 | 97.15 | −1.58 | 1.90 | 92.80 | 92.11 | — |
| | 1 | 96.68 | −1.40 | 2.11 | 91.66 | 90.94 | −1.27% |
| | 2 | 96.51 | −1.35 | 2.35 | 91.25 | 90.32 | −1.97% |
| | 3 | 96.39 | −1.38 | 2.40 | 90.95 | 90.02 | −2.31% |
| Example 6 | 0 | 96.58 | −1.81 | 2.35 | 91.21 | 90.20 | — |
| | 1 | 95.23 | −1.83 | 2.75 | 90.03 | 89.29 | −1.00% |
| | 2 | 95.40 | −1.93 | 3.25 | 89.22 | 88.12 | −2.32% |
| | 3 | 95.54 | −1.95 | 3.45 | 87.11 | 87.90 | −2.54% |
| Comparison 1 | 0 | 96.28 | −1.71 | 2.30 | 91.21 | 90.30 | — |
| | 1 | 95.43 | −1.77 | 2.70 | 89.62 | 88.89 | −1.56% |
| | 2 | 95.60 | −1.83 | 3.20 | 88.53 | 87.35 | −3.32% |
| | 3 | 95.64 | −1.86 | 3.40 | 87.12 | 86.03 | −4.89% |
| Comparison 2 | 0 | 94.12 | −1.61 | 3.90 | 85.90 | 84.16 | — |
| | 1 | 93.92 | −1.62 | 4.35 | 85.30 | 82.54 | −1.92% |
| | 2 | 93.75 | −1.58 | 4.42 | 84.55 | 81.00 | −3.83% |
| | 3 | 93.62 | −1.50 | 4.51 | 84.00 | 79.93 | −5.22% |

TABLE 5-continued

Evaluation of Reflectance after UV Treatment after Final Curing

| | UV counts | Lab | | | Average reflctance (%) | Reflectance by wavelength (%) 450 nm | Reflectance reduction ratio |
|---|---|---|---|---|---|---|---|
| | | 450 nm | | | | | |
| Comparison 3 | 0 | 95.22 | −1.69 | 3.31 | 88.02 | 86.15 | — |
| | 1 | 94.97 | −1.64 | 3.82 | 87.95 | 84.13 | −2.34% |
| | 2 | 94.50 | −1.59 | 3.91 | 87.83 | 82.21 | −4.68% |
| | 3 | 94.12 | −1.52 | 4.07 | 87.02 | 81.11 | −6.13% |

In Examples 1 to 6, the average reflectance (reflow conducted 0, 1, 2, 3 times) and the reflectance at 450 nm were higher than those of Comparisons 1 to 3. In addition, in the case of Examples 1 to 6, the average reflectance and the reflectance at 450 nm were reduced to the range of 1.78% to 2.54%, respectively, even after the UV treatment was performed three times after the final curing, so it could be confirmed that the reduction of reflectance was low even after the UV treatment after the final curing.

On the other hand, in the case of Comparisons 1 to 3, the reflectance was reduced by 4.89%, 5.22%, and 6.13%, respectively, and thus it was confirmed that the reflectance was significantly reduced after the UV treatment after the final curing, compared to Examples 1 to 6.

Meanwhile, in Examples 1 to 6, b values before and after reflow were smaller than those of Comparisons 1 to 3. This indicates that yellowing of Examples 1 to 6 is less than that of the Comparisons 1 to 3.

<Blue Light Test>

The dry films prepared in Examples 1 and 2 and Comparison 1 were laminated, exposed to 300 mJ/cm$^2$ as measured by an integrating photometer, and developed in a 1% $Na_2CO_3$ aqueous solution of 30° C. for 60 seconds at a spray pressure of 0.2 MPa., and then cured in an oven at 150° C. for 60 minutes to obtain a substrate. The reflectance at a wavelength of 450 nm was measured on the coating surface of the obtained substrate using a spectrophotometer (CM-2600d, Konica Minolta Sensing Co., Ltd.). The results are shown in Table 6. (Blue light test condition: measured for each time period at 450 nm. after being left for a measurement time of 3000 hours, measurement equipment blue light tester, output 15.9 mW, light emission wavelength 450 nm, measurement area: 0.708 cm2)

TABLE 6

Reflectance Evaluation after 3000 Hours of Blue Light

| Hours | Example 1 L | Example 1 a | Example 1 b | Example 1 450 nm Reflectance (%) | Example 1 Reflectance change rate | Example 2 L | Example 2 a | Example 2 b |
|---|---|---|---|---|---|---|---|---|
| 0 | 96.78 | −0.83 | 0.67 | 92.41 | — | 96.77 | −0.82 | 0.40 |
| 500 | 96.91 | −0.79 | 0.83 | 92.51 | +0.11% | 96.66 | −0.79 | 0.55 |
| 1000 | 96.74 | −0.82 | 0.88 | 92.02 | −0.42% | 96.71 | −0.8 | 0.57 |
| 1500 | 96.87 | −0.88 | 1.09 | 92.20 | −0.23% | 96.77 | −0.86 | 0.70 |
| 2000 | 96.77 | −0.88 | 1.21 | 91.72 | −0.75% | 96.71 | −0.84 | 0.76 |
| 2500 | 96.82 | −0.89 | 1.51 | 91.42 | −1.08% | 96.75 | −0.88 | 1.01 |
| 3000 | 96.58 | −0.93 | 1.53 | 90.80 | −1.76% | 96.69 | −0.93 | 1.08 |

| Hours | Example 2 450 nm Reflectance (%) | Example 2 Reflectance change rate | Comparison 1 L | Comparison 1 a | Comparison 1 b | Comparison 1 450 nm Reflectance (%) | Comparison 1 Reflectance change rate |
|---|---|---|---|---|---|---|---|
| 0 | 92.84 | — | 96.48 | −0.84 | 0.73 | 91.99 | — |
| 500 | 92.38 | −0.50% | 95.93 | −0.8 | 1.19 | 90.39 | −1.74% |
| 1000 | 92.45 | −0.42% | 95.9 | −0.77 | 1.21 | 90.35 | −1.81% |
| 1500 | 92.54 | −0.32% | 95.64 | −0.79 | 2.73 | 88.00 | −4.42% |
| 2000 | 92.25 | −0.64% | 94.82 | −0.74 | 3.21 | 86.50 | −6.24% |
| 2500 | 92.03 | −0.88% | 94.75 | −0.76 | 4.90 | 84.60 | −8.54% |
| 3000 | 91.82 | −1.11% | 94.2 | −0.76 | 5.70 | 82.00 | −11.81% |

Examples 1 and 2 had higher reflectance at 450 nm than Comparison 1 in all seven categories of hours observed. In addition, in Examples 1 and 2, reflectance was reduced by 1.76% and 1.11%, respectively, even after irradiating blue light for 3000 hours, but in Comparison 1, reflectance was reduced by 11.81%, and thus, it was confirmed that in Examples 1 and 2, reflectance reduction rate was lower after irradiating blue light for 3000 hours than in Comparison 1.

<Test in Chamber (Temperature 85° C., Humidity 85%), Reflectance Test in HS Chamber>

The dry film prepared in Example 2 was laminated, exposed to 300 mJ/cm$^2$ as measured by an integrating photometer and developed in a 1% $Na_2CO_3$ aqueous solution of 30° C. under a spray pressure of 0.2 MPa for 60 seconds, and then cured in an oven at 150° C. for 60 minutes to obtain a substrate. The obtained substrate was placed in a chamber (HIFLEX, Temperature and humidity chamber, ETAC) having a temperature of 85° C. and a humidity of 85% and was left for 1000 hours. The reflectance at a wavelength of 450 nm was measured using a spectrophotometer (CM-2600d, Konica Minolta Sensing Co., Ltd.) on the substrate left in the HS chamber for 1000 hours. The results are shown in Table 7.

TABLE 7

Evaluation of Reflectance After left in the Chamber at Temperature 85° C. and Humidity 85%
Evaluation Results for Example 2 at 85° C./85%

| Hours | L | a | B | Average Reflectance (%) | 450 nm Reflectance (%) | Reflectance change rate |
|---|---|---|---|---|---|---|
| 0 | 96.95 | −1.46 | 1.76 | 92.33 | 91.74 | — |
| 500 hrs | 96.86 | −1.73 | 2.15 | 92.10 | 91.16 | −0.64% |
| 1000 hrs | 96.58 | −2.02 | 2.84 | 91.42 | 89.16 | −2.88% |

For Example 2, even when evaluated for a long period of time under the conditions of high temperature and humidity, the average reflectance and the reflectance at 450 nm were reduced by only 0.64% at 500 hours and by only 2.88% at 1000 hours, and thus it could be confirmed that the reduction in reflectance was low even under high temperature and high humidity conditions.

<Crack Resistance Evaluation Result (Erichsen Test)>

The dry film (55 μm) manufactured in each Example and Comparative Example was laminated on a Cu substrate (1600 μm), exposed, developed, and cured in an oven at 150° C. for 60 minutes to manufacture a substrate. Whether cracks occurred on the coating film surface of the obtained substrate was measured, and the results are shown in Tables 8-1 and 8-2.

Evaluation of Crack Occurrence

○: Slight cracks occurred

×: Severe cracking occurred

TABLE 8-1

Crack resistance evaluation

| categories | Example 1 | Example 2 | Example 3 | Example 4 | Example 5 | Example 6 | Comparison 1 | Comparison 2 | Comparison 3 |
|---|---|---|---|---|---|---|---|---|---|
| Evaluation of crack occurrence | ○ | ○ | ○ | ○ | ○ | ○ | X | X | X |

TABLE 8-2

Crack resistance evaluation

| categories | Example 7 | Example 8 | Example 9 | Comparison 4 | Comparison 5 | Comparison 6 | Comparison 7 | Comparison 8 | Comparison 9 |
|---|---|---|---|---|---|---|---|---|---|
| Crack resistance | ○ | ○ | ○ | X | ○ | ○ | ○ | ○ | ○ |

FIG. 2 shows Erichsen test results of Examples 1 to 9 and Comparisons 1 to 9. In the case of Examples 1 to 9, cracks occurred slightly, while in the case of Comparisons 1 to 4, cracks occurred severely.

<Gloss Evaluation>

The dry films prepared in Examples and Comparisons were laminated, exposed, developed, and cured in an oven at 150° C. for 60 minutes to prepare a substrate. Gloss at an angle of 60° was measured on the coating surface of the obtained substrate using a gloss meter (BYK E-4430). The results are shown in Tables 9-1 and 9-2.

Gloss Evaluation

Pass: the degree of gloss is 80 or more

NG: the degree of gloss is 80 or less

TABLE 9-1

Evaluation results for gloss

| Categories | Example 1 | Example 2 | Example 3 | Example 4 | Example 5 | Example 6 | Comparison 1 | Comparison 2 | Comparison 3 |
|---|---|---|---|---|---|---|---|---|---|
| The degree of gloss | 88 | 87 | 89 | 89 | 89 | 89 | 67 | 65 | 65 |
| gloss | Pass | Pass | Pass | Pass | Pass | Pass | NG | NG | NG |

TABLE 9-2

Evaluation results for gloss

| Categories | Example 7 | Example 8 | Example 9 | Comparison 4 | Comparison 5 | Comparison 6 | Comparison 7 | Comparison 8 | Comparison 9 |
|---|---|---|---|---|---|---|---|---|---|
| gloss | Pass | Pass | Pass | Pass | Pass | Pass | Pass | Pass | Pass |

Examples 1 to 9 had higher gloss than Comparisons 1 to 3.

Evaluation of Method of Manufacturing Printed Wiring Board Including Solder Resist Layer Example 6

(1) The test substrate was buffed and washed, and then moisture was removed and it was dried.

(2) The protective film, PP film, was removed from the dry film prepared in Example 1 and then the resulting film was placed on a test substrate, and then vacuum laminated by using vacuum lamination (Nikko Materials's equipment) to transfer onto the substrate. (Vacuum lamination conditions: 1st chamber-60° C., 3.0 hpa, 10 sec./0.2 Mpa, 10 sec, $2^{nd}$ chamber −70° C.)

(3) The PET film was peeled off.

(4) The substrate, to which the dry film with the PET film peeled off was transferred, was exposed, with a DI exposure apparatus manufactured by Screen, to 300 $mJ/cm^2$ as measured by an integrating photometer, using a pattern film of TAIYO INK KOREA (DI UV Exposure: SCREEN LEDIA5, 300 $mJ/cm^2$).

(5) After cooling the substrate at room temperature, the substrate was developed in a developing device. (Developing condition: 1 wt % $Na_2CO_3$ at 30° C., 0.2 MPa, 60 seconds.)

(6) Forming of a solder resist pattern was completed.

(7) The substrate on which the pattern had been formed through the development was cured in an oven at 150° C. for 1 hour, and thus, completing the substrate manufacture.

Comparison 3

The manufacture of the printed wiring board was completed in the same manner as in Example 6, except that PET film was not peeled off before UV exposure and the substrate was exposed with the PET film attached.

<Evaluation of Printed Wiring Board>

The substrates prepared in Example 6 and Comparison 3 were observed. The result is shown in FIG. 1.

FIG. 1 is a comparison between a printed wiring board which has been exposed with a base film peeled off before UV exposure and a printed wiring board which has been exposed without a base film being peeled off before UV exposure. In FIG. 1, the numbers refer to lines and spaces between lines and are also referred to as Line/Space. Thus, 100/100 means that a line has a width of 100 μm and that there is a gap of 100 μm between lines. A smaller value thereof means better resolution.

Because the printed wiring board of Example 6 was UV-exposed after the PET film was peeled off, the solder resist pattern was well formed and it had high resolution. On the other hand, in the printed wiring board of Comparison 3, UV exposure was performed without peeling off the PET film, and thus the solder resist pattern was not implemented and the resolution was very low. (FIG. 1)

The invention claimed is:

1. A solder resist composition comprising (A) a carboxyl group-containing resin not containing an aromatic ring, (B) an inorganic filler, (C) a mercapto-modified acrylate and (D) a resin containing an aromatic ring, wherein the content of (C) the mercapto-modified acrylate is from 2% by mass to 6% by mass based on the total composition in terms of solids content.

2. The solder resist composition according to claim 1, which is white.

3. The solder resist composition according to claim 1, further comprising a thermosetting resin.

4. The solder resist composition according to claim 3, wherein the thermosetting resin is an epoxy resin.

5. The solder resist composition according to claim 3, wherein the equivalent ratio (epoxy group/carboxyl group equivalent ratio) obtained by dividing the epoxy group equivalent contained in the epoxy resin by the carboxyl group equivalent contained in the carboxyl group-containing resin is 0.5 or more and 1.2 or less.

6. The solder resist composition according to claim 1, wherein (C) the mercapto-modified acrylate is an aliphatic compound having 1 to 15 carbon atoms substituted with at least one functional group selected from the group consisting of acryloyl group, acryloyloxy group and acryloyloxy-alkyl group.

7. A dry film having a solder resist layer which is obtained by applying the solder resist composition of claim 1 on the base film and drying it.

8. A cured product obtained by curing the solder resist layer of the dry film according to claim 7.

9. A printed wiring board comprising the cured product of claim 8.

10. A method of preparing a printed wiring board, comprising the following steps:

1) laminating the dry film of claim 7 so that the solder resist layer is combined on a substrate, and vacuum laminating;
2) Peeling the base film of the dry film, and then exposing the solder resist layer;
3) Forming a pattern by developing the solder resist layer to remove the unexposed areas of the solder resist layer; and
4) Curing the substrate on which the pattern is formed.

11. A method of preparing a dry film, comprising the following steps:

1) applying the solder resist composition of claim 1 on a base film;
2) Drying the applied solder resist composition to form a solder resist layer; and
3) Combining the dried solder resist layer with a protective film.

* * * * *